United States Patent
Shimura

(10) Patent No.: US 9,679,912 B1
(45) Date of Patent: Jun. 13, 2017

(54) SEMICONDUCTOR DEVICE

(71) Applicant: Kabushiki Kaisha Toshiba, Minato-ku (JP)

(72) Inventor: Yasuhiro Shimura, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/057,566

(22) Filed: Mar. 1, 2016

Related U.S. Application Data

(60) Provisional application No. 62/262,672, filed on Dec. 3, 2015.

(51) Int. Cl.
  *H01L 29/76* (2006.01)
  *H01L 27/11582* (2017.01)
  *H01L 23/528* (2006.01)
  *H01L 23/532* (2006.01)

(52) U.S. Cl.
  CPC ...... *H01L 27/11582* (2013.01); *H01L 23/528* (2013.01); *H01L 23/5329* (2013.01)

(58) Field of Classification Search
  USPC ....... 257/314, 324, 315, 329, 330, 302–304, 257/306, 311, 255–266, 257/E21.179–E21.182, E21.209–E21.21, 257/E21.422, 225–234, 390, E27.076; 438/275–278, 396; 365/185.05, 185.17, 365/185.18, 185.2, 51
  See application file for complete search history.

(56) References Cited

U.S. PATENT DOCUMENTS

| | | | |
|---|---|---|---|
| 8,455,940 B2 | 6/2013 | Lee et al. | |
| 8,723,247 B2 | 5/2014 | Komori et al. | |
| 8,779,499 B2 | 7/2014 | Kiyotoshi | |
| 2009/0242967 A1* | 10/2009 | Katsumata | H01L 21/764 257/324 |
| 2011/0057250 A1* | 3/2011 | Higashi | H01L 27/11578 257/324 |
| 2011/0147824 A1* | 6/2011 | Son | G11C 16/0483 257/324 |
| 2012/0001250 A1* | 1/2012 | Alsmeier | H01L 27/11551 257/319 |
| 2012/0018796 A1* | 1/2012 | Yahashi | H01L 27/11573 257/324 |
| 2012/0039130 A1* | 2/2012 | Yoon | G11C 16/0483 365/185.18 |

(Continued)

*Primary Examiner* — Tram H Nguyen
(74) *Attorney, Agent, or Firm* — Oblon, McClelland, Maier & Neustadt, L.L.P.

(57) ABSTRACT

According to one embodiment, a semiconductor device includes: a substrate; a stacked body; a columnar portion; and a plate portion. The substrate has a major surface. The stacked body includes a plurality of electrode layers stacked with an insulator interposed. The columnar portion includes a semiconductor body and a memory film. The memory film includes a charge storage portion. The plate portion is provided in the stacked body. The plate portion extends along the stacking direction of the stacked body and a major surface direction of the substrate. The plate portion includes a plate conductor and a sidewall insulating film. The sidewall insulating film provided between the plate conductor and the stacked body. The stacked body includes an air gap. The air gap is provided between the sidewall insulating film and the electrode layer.

17 Claims, 27 Drawing Sheets

(56) References Cited

U.S. PATENT DOCUMENTS

| | | | | |
|---|---|---|---|---|
| 2012/0043599 A1* | 2/2012 | Katsumata | .......... | H01L 27/1157 |
| | | | | 257/314 |
| 2012/0241841 A1* | 9/2012 | Mizushima | ....... | H01L 21/28282 |
| | | | | 257/324 |
| 2012/0267699 A1* | 10/2012 | Kiyotoshi | ......... | H01L 27/11524 |
| | | | | 257/319 |
| 2016/0268293 A1* | 9/2016 | Kamigaichi | ...... | H01L 27/11582 |

* cited by examiner

SEMICONDUCTOR DEVICE

CROSS-REFERENCE TO RELATED APPLICATIONS

This application is based upon and claims the benefit of priority from U.S. Provisional Patent Application 62/262,672 field on Dec. 3, 2015; the entire contents of which are incorporated herein by reference.

FIELD

Embodiments described herein relate generally to a semiconductor device.

BACKGROUND

A memory device having a three-dimensional structure has been proposed in which a memory hole is made in a stacked body in which multiple electrode layers are stacked, and a charge storage film and a semiconductor film are provided to extend in the stacking direction of the stacked body in the memory hole. The memory device includes multiple memory cells connected in series between a drain-side selection transistor and a source-side selection transistor. The electrode layers of the stacked body are gate electrodes of the drain-side selection transistor, the source-side selection transistor, and the memory cells. A slit that reaches a substrate from the upper surface of the stacked body is made in the stacked body. A conductor is filled into the slit. For example, the conductor is used to form a source line. To reduce the cell size, it is effective to reduce the distance between the source line and the electrode layers. However, the distance between the source line and the electrode layers is determined by the electrical breakdown voltage between the source line and the electrode layers. Therefore, it is difficult to reduce the distance between the source line and the electrode layers unless the electrical breakdown voltage between the source line and the electrode layers can be increased. It is desirable to increase the electrical breakdown voltage between the source line and the electrode layers.

DETAILED DESCRIPTION

Figure 1:
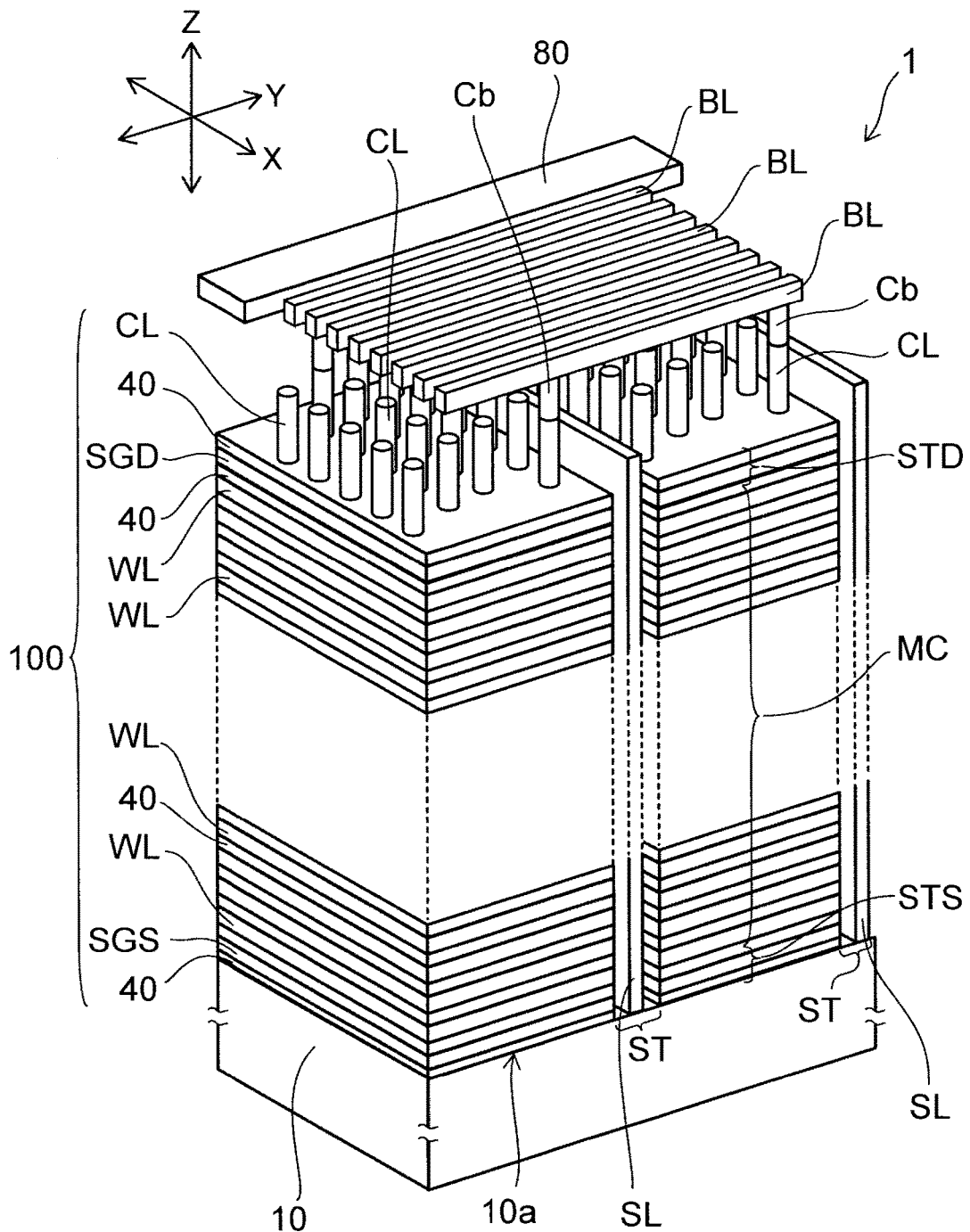
FIG. 1 is a schematic perspective view of a memory cell array of a semiconductor device of a first embodiment.

According to one embodiment, a semiconductor device includes a substrate; a stacked body; a columnar portion; and a plate portion. The substrate has a major surface. The stacked body is provided on the major surface of the substrate. The stacked body includes a plurality of electrode layers stacked with an insulator interposed. The columnar portion is provided in the stacked body. The columnar portion extends along a stacking direction of the stacked body. The columnar portion includes a semiconductor body and a memory film. The memory film is provided between the semiconductor body and the electrode layer. The memory film includes a charge storage portion. The plate portion is provided in the stacked body. The plate portion extends along the stacking direction of the stacked body and a major surface direction of the substrate. The plate portion includes a plate conductor and a sidewall insulating film. The sidewall insulating film provided between the plate conductor and the stacked body. The stacked body includes an air gap. The air gap is provided between the sidewall insulating film and the electrode layer.

Embodiments will now be described with reference to the drawings. In the respective drawings, like members are labeled with like reference numerals. The semiconductor device of the embodiment is a semiconductor memory device including a memory cell array.

First Embodiment

FIG. 1 is a schematic perspective view of a memory cell array 1 of a semiconductor device of a first embodiment. In FIG. 1, two mutually-orthogonal directions parallel to a major surface 10a of a substrate 10 are taken as an X-direction and a Y-direction. The XY plane is taken to be a planar direction of a stacked body 100. A direction orthogonal to both the X-direction and the Y-direction is taken as a Z-direction (the stacking direction of the stacked body 100). In the specification, "down" refers to the direction toward the substrate 10; and "up" refers to the direction away from the substrate 10.

As shown in FIG. 1, the memory cell array 1 includes the stacked body 100, multiple columnar portions CL, and multiple slits ST. The stacked body 100 includes a drain-side selection gate line SGD, multiple word lines WL, and a source-side selection gate line SGS.

The source-side selection gate line (the lower gate layer) SGS is provided on the substrate 10. The substrate 10 is, for example, a semiconductor substrate. The semiconductor substrate includes, for example, silicon. The silicon that is included in the substrate 10 is single crystalline silicon. The portion of the substrate 10 that includes the single crystalline silicon where the memory cell array 1 is provided includes a carrier. The carrier is, for example, an acceptor. The acceptor is, for example, boron. Thereby, the conductivity type of the substrate 10 is a P-type in the portion where the memory cell array 1 is provided. The multiple word lines WL are provided on the source-side selection gate line SGS. The drain-side selection gate line (the upper gate layer) SGD is provided on the multiple word lines WL. The drain-side selection gate line SGD, the multiple word lines WL, and the source-side selection gate line SGS are electrode layers. The number of stacks of electrode layers is arbitrary.

The electrode layers (SGD, WL, and SGS) are stacked to be separated from each other. An insulator 40 is disposed in each region between the electrode layers (SGD, WL, and SGS). The insulator 40 may be an insulator such as a silicon oxide film, etc., or may be an air gap.

At least one selection gate line SGD is used as a gate electrode of a drain-side selection transistor STD. At least one selection gate line SGS is used as a gate electrode of a source-side selection transistor STS. Multiple memory cells MC are connected in series between the drain-side selection transistor STD and the source-side selection transistor STS. One of the word lines WL is used as a gate electrode of the memory cell MC.

The slit ST is provided in the stacked body 100. The slit ST is provided in the memory cell array of the stacked body 100. The slit ST extends along the stacking direction of the stacked body 100 (the Z-direction) and the major surface direction of the substrate 10 (the X-direction) in the interior of the stacked body 100. The slit ST divides the stacked body 100 into a plurality in the Y-direction. The region that is divided by the slit ST is called a "block." A source line SL is provided in the slit ST. The source line SL is a conductor.

The columnar portion CL is provided in the stacked body 100 divided by the slit ST. The columnar portion CL is provided in the memory cell array of the stacked body 100. The columnar portion CL extends in the stacking direction of the stacked body 100 (the Z-direction) in the interior of the stacked body 100. For example, the columnar portion CL is formed in a circular columnar configuration or an elliptical columnar configuration. For example, the columnar portion CL is disposed in a staggered arrangement or a square grid pattern in the memory cell array 1. The drain-side selection transistor STD, the multiple memory cells MC, and the source-side selection transistor STS are disposed in the columnar portion CL.

Multiple bit lines BL are disposed above the upper end portion of the columnar portion CL. The multiple bit lines BL extend in the Y-direction. The upper end portion of the columnar portion CL is electrically connected via a contact portion Cb to one of the bit lines BL. One bit line is electrically connected to one columnar portion CL selected from each blocks.

Figure 2:
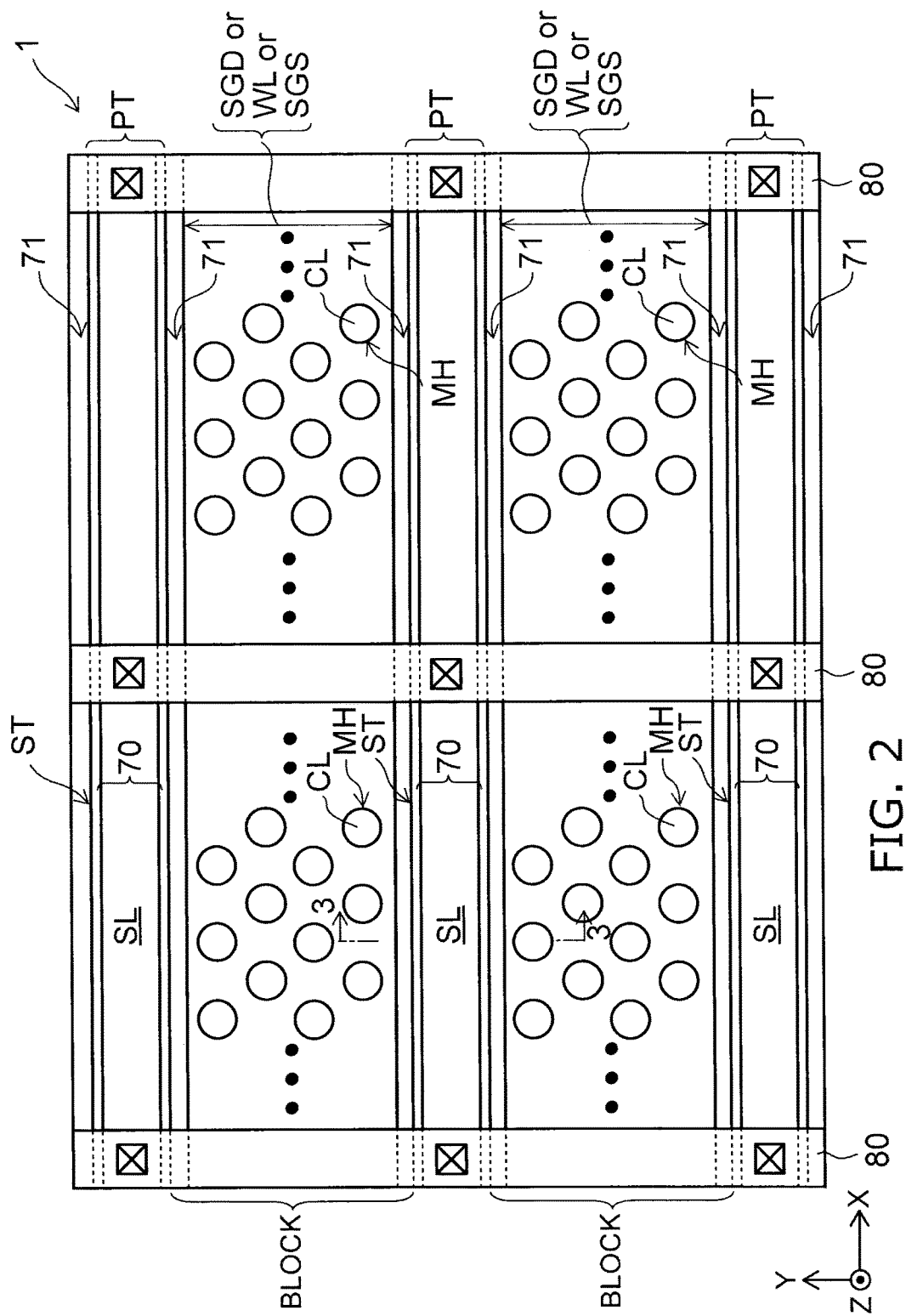
FIG. 2 is a schematic plan view of the memory cell array of the semiconductor device of the first embodiment.
Figure 3:
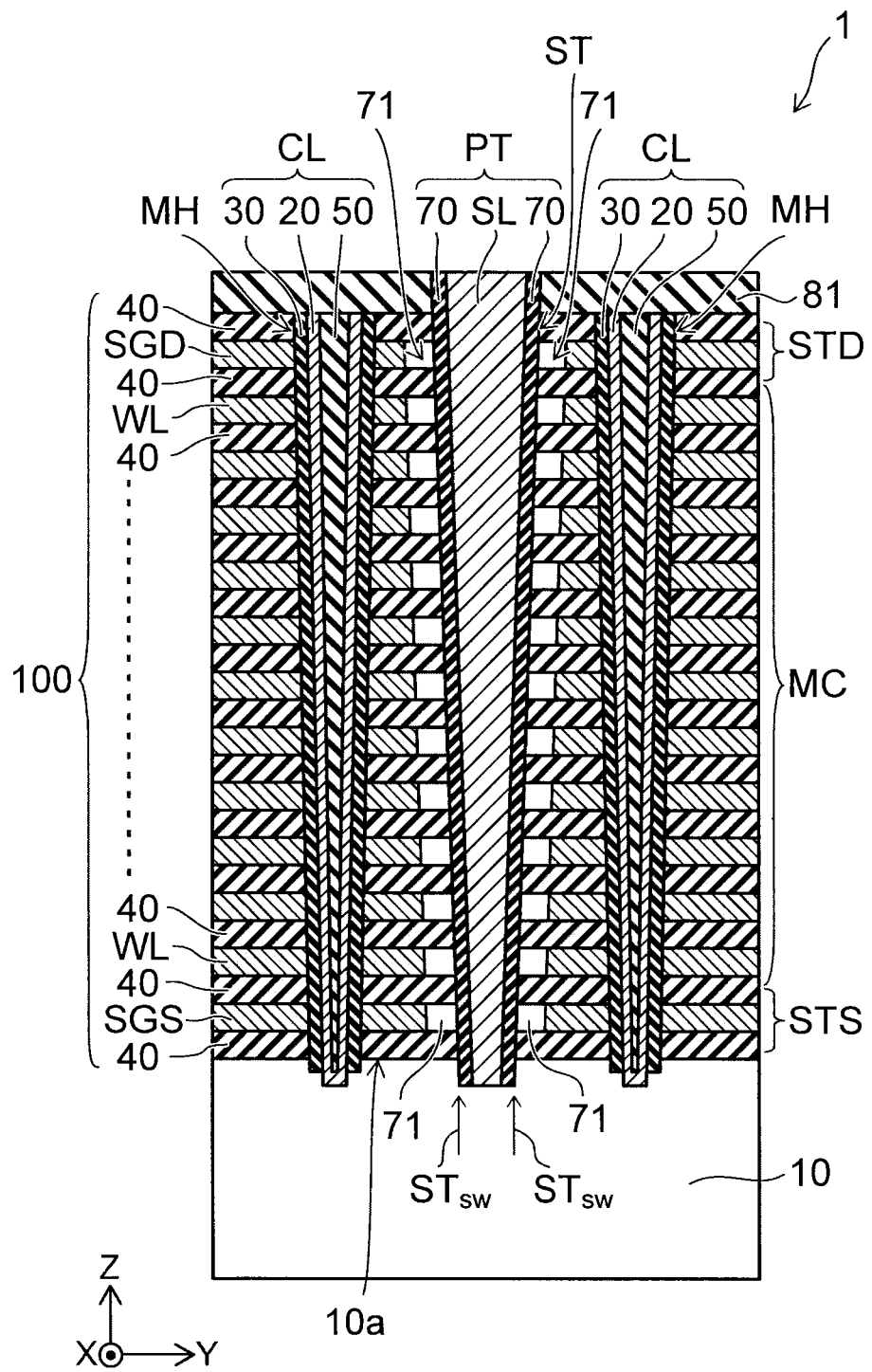
FIG. 3 is a schematic cross-sectional view of the memory cell array of the semiconductor device of the first embodiment.
Figure 4:
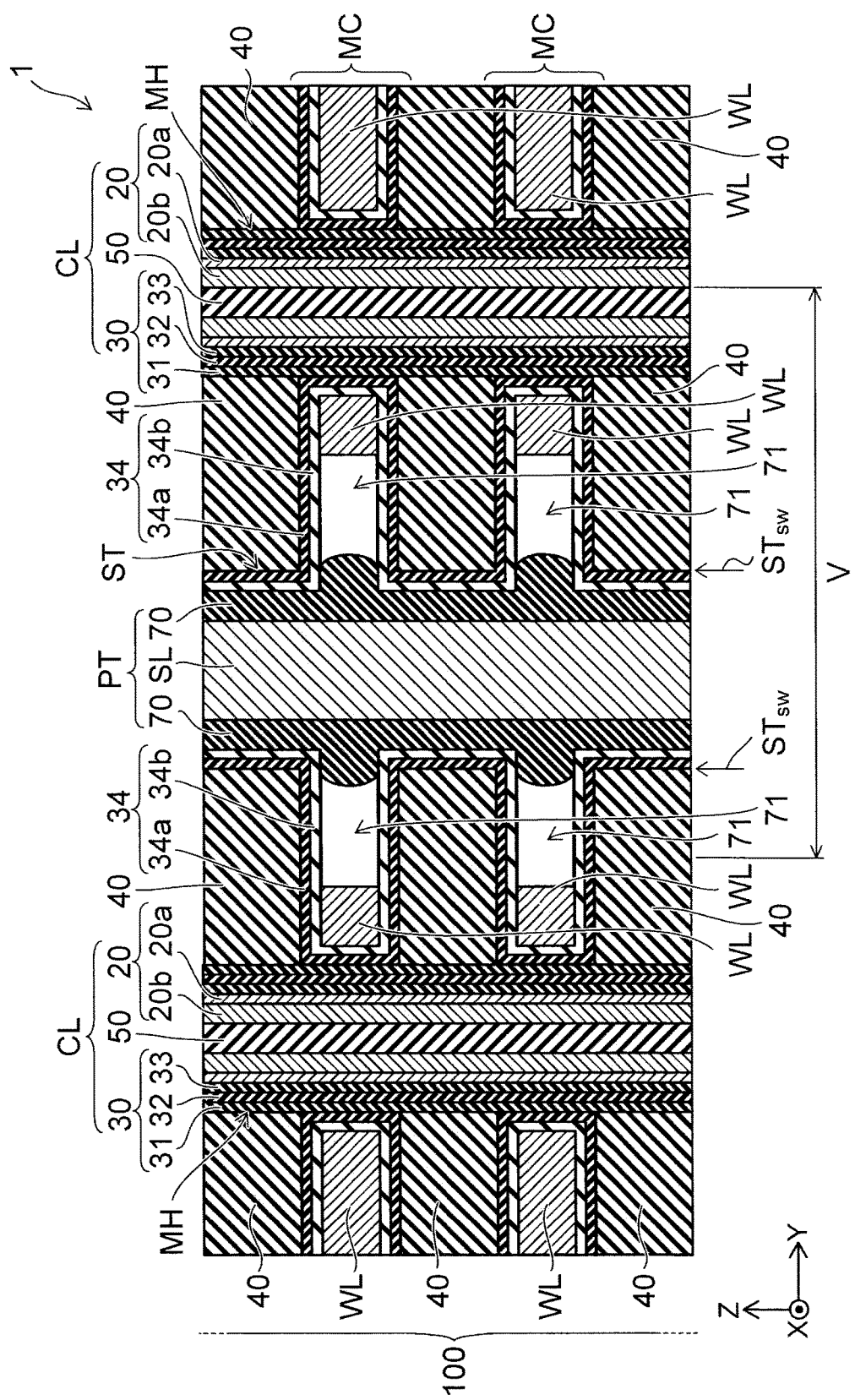
FIG. 4 is a schematic cross-sectional view in which the cross section shown in FIG. 3 is enlarged.

FIG. 2 is a schematic plan view of the memory cell array 1 of the semiconductor device of the first embodiment. FIG. 3 is a schematic cross-sectional view of the memory cell array 1 of the semiconductor device of the first embodiment. The cross section shown in FIG. 3 roughly is along line 3-3 in FIG. 2. FIG. 4 is a schematic structure cross-sectional view in which the cross section of the slit ST and the intermediate portion of the stacked body 100 including the columnar portions CL on two sides of the slit ST in FIG. 3 is enlarged. FIG. 4 shows an extracted intermediate portion of the stacked body 100. A schematic cross section of the memory cells MC is shown in FIG. 4. The bit lines BL are not shown in FIG. 2. An upper layer interconnect 80 and the bit lines BL are not shown in FIG. 3 and FIG. 4.

As shown in FIG. 2 to FIG. 4, the columnar portion CL is provided inside a memory hole (a hole) MH. The memory hole MH is provided in the memory cell array 1 of the stacked body 100. The memory hole MH extends along the stacking direction of the stacked body 100 (the Z-direction) in the stacked body 100. The columnar portion CL includes a memory film 30, a semiconductor body 20, and a core layer 50.

The memory film 30 is provided on the inner wall of the memory hole MH. The configuration of the memory film 30 is, for example, a tubular configuration. The memory film 30 includes a cover insulating film 31, a charge storage film 32, and a tunneling insulating film 33.

The cover insulating film 31 is provided on the inner wall of the memory hole MH. The cover insulating film 31 includes, for example, silicon oxide. For example, the cover insulating film 31 protects the charge storage film 32 from the etching when forming the electrode layers (SGD, WL, and SGS).

The charge storage film 32 is provided on the cover insulating film 31. The charge storage film 32 includes, for example, silicon nitride. Other silicon nitride, the charge storage film 32 may include hafnium oxide. The charge storage film 32 has trap sites that trap charge in a film. The charge is trapped in the trap sites. The threshold of the memory cell MC changes due to the existence/absence or amount of the charge trapped in the charge storage film 32. Thereby, the memory cell MC retains information.

The tunneling insulating film 33 is provided on the charge storage film 32. The tunneling insulating film 33 includes, for example, silicon oxide, or includes silicon oxide and silicon nitride. The tunneling insulating film 33 is a potential barrier between the charge storage film 32 and the semiconductor body 20. Tunneling of the charge occurs in the tunneling insulating film 33 when the charge is injected from the semiconductor body 20 into the charge storage film 32 (a programming operation) and when the charge is discharged from the charge storage film 32 into the semiconductor body 20 (an erasing operation).

The semiconductor body 20 is provided on the memory film 30. The semiconductor body 20 of the first embodiment includes a cover layer 20a and a channel layer 20b. The cover layer 20a is provided on the tunneling insulating film 33. The configuration of the cover layer 20a is, for example, a tubular configuration. The channel layer 20b is provided on the cover layer 20a. The configuration of the channel layer 20b is, for example, a tubular configuration having a bottom. The cover layer 20a and the channel layer 20b include, for example, silicon. The silicon is, for example, polysilicon made of amorphous silicon that is crystallized. The conductivity type of the silicon is, for example, a P-type. For example, the semiconductor body 20 is electrically connected to the substrate 10.

The core layer 50 is provided on the semiconductor body 20. The core layer 50 is insulative. The core layer 50 includes, for example, silicon oxide. The configuration of the core layer 50 is, for example, a columnar configuration.

The memory hole MH is filled with the memory film 30, the semiconductor body 20, and the core layer 50. An insulating film 81 is formed on the stacked body 100 and the memory hole MH. The insulating film 81 includes, for example, silicon oxide. The insulating film 81 covers the memory hole MH and protects the memory film 30, the semiconductor body 20, and the core layer 50 from the processes, e.g., the etching processes, etc., that are performed subsequently.

A blocking insulating film 34 is provided on the insulator 40, between the insulator 40 and the electrode layers (SGD, WL, and SGS), and between the memory film 30 and the electrode layers (SGD, WL, and SGS). For example, the blocking insulating film 34 suppresses back-tunneling of the charge from the word lines WL into the charge storage film 32 in the erasing operation. The blocking insulating film 34 of the first embodiment includes a first blocking insulating layer 34a and a second blocking insulating layer 34b. For example, the first blocking insulating layer 34a is provided on the insulator 40 and the cover insulating film 31. For example, the second blocking insulating layer 34b is provided on the first blocking insulating layer 34a. The relative dielectric constant of the second blocking insulating layer 34b is higher than the relative dielectric constant of the first blocking insulating layer 34a. Thereby, compared to the case of the first blocking insulating layer 34a, the back-tunneling of the charge can be suppressed better. For example, the first blocking insulating layer 34a includes silicon oxide. The second blocking insulating layer 34b includes a metal oxide. The metal oxide is, for example, aluminum oxide. The aluminum oxide is, for example, alumina ($Al_2O_3$).

The electrode layers (SGD, WL, and SGS) are provided on the blocking insulating film 34 in the interior of the stacked body 100. The electrode layers (SGD, WL, and SGS) include, for example, tungsten. The electrode layers (SGD, WL, and SGS) surround the periphery of the columnar portion CL.

In the first embodiment, the slit ST is provided in the insulating film 81 and the stacked body 100. A plate portion PT is provided in the slit ST. The plate portion PT includes the source line SL and a sidewall insulating film 70. The sidewall insulating film 70 is provided between the stacked body 100 and the plate portion PT. The sidewall insulating film 70 includes, for example, silicon oxide. The configuration of the sidewall insulating film 70 is a frame-like configuration having a major axis along the X-direction and a minor axis along the Y-direction. The source line SL is provided on the sidewall insulating film 70. The source line SL includes, for example, tungsten. The configuration of the source line SL is a plate configuration having a major axis along the X-direction and a minor axis along the Y-direction. The source line SL is insulated from the stacked body 100 by the sidewall insulating film 70. For example, the source line SL is electrically connected to the substrate 10.

The stacked body 100 includes an air gap 71. The air gap 71 is provided between the sidewall insulating film 70 and the electrode layers (SGD, WL, and SGS). In the first embodiment, the air gap 71 is provided between the sidewall insulating film 70 and all of the electrode layers from the lowermost electrode layer (e.g., the source-side selection gate line SGS) to the uppermost electrode layer (e.g., the drain-side selection gate line SGD). The lowermost electrode layer is the electrode layer that is most proximal to the major surface 10a of the substrate 10. The uppermost electrode layer is the electrode layer that is most distal to the major surface 10a of the substrate 10 along the stacking direction (the Z-direction).

In the memory cell array 1, the air gap 71 is provided to be continuous along the plate portion PT in the direction of the major surface 10a of the substrate 10. In the first embodiment as shown in FIG. 2, the direction in which the air gap 71 is provided to be continuous is the X-direction. In the first embodiment, the air gap 71 is provided in a line configuration along the plate portion PT in the X-direction. The air gap 71 and the electrode layers (SGD, WL, and SGS) exist along the Y-direction between the plate portion PT and the plate portion PT. The electrode layers (SGD, WL, and SGS) are provided along the Y-direction between the air gap 71 and the air gap 71. The region between the plate portion PT and the plate portion PT is a "block." The "block" is the erasing unit of the data.

The semiconductor device of the first embodiment includes the air gap 71 between the sidewall insulating film 70 and the electrode layers (SGD, WL, and SGS) along the direction of the major surface 10a of the substrate 10. Therefore, the distance between the source line SL and the electrode layers (SGD, WL, and SGS) is long compared to the case where the air gap 71 is not included. Accordingly, according to the first embodiment, compared to the case where the air gap 71 is not included, the electrical breakdown voltage between the source line SL and the electrode layers (SGD, WL, and SGS) increases.

Also, in addition to the sidewall insulating film 70, the semiconductor device of the first embodiment includes the air gap 71 as an insulator that electrically insulates the source line SL and the electrode layers (SGD, WL, and SGS). Therefore, compared to the case where the sidewall insulating film 70 and a dielectric that is a film exist between the source line SL and the electrode layers (SGD, WL, and SGS), for example, the occurrence of leakage paths via defects, etc., in the film also can be suppressed. Therefore, the insulative properties between the source line SL and the electrode layers (SGD, WL, and SGS) also are excellent. Moreover, the relative dielectric constant of the air gap 71 can be about 1.0 which is substantially equal to the dielectric constant of a vacuum. Therefore, the electrical capacitance (the parasitic capacitance) at the electrode layers (SGD, WL, and SGS) periphery also is reduced. Accordingly, the signal transfer properties of the electrode layers (SGD, WL, and SGS) improve; and the semiconductor device of the first embodiment is advantageous also for increasing the speed of operations of the semiconductor device.

A method for manufacturing the semiconductor device of the first embodiment will now be described.

FIG. 5 to FIG. 11 are schematic cross-sectional views showing the method for manufacturing the semiconductor device of the first embodiment. For example, the cross sections shown in FIG. 5 to FIG. 11 correspond to a portion of area V shown in FIG. 4.

Figure 5:
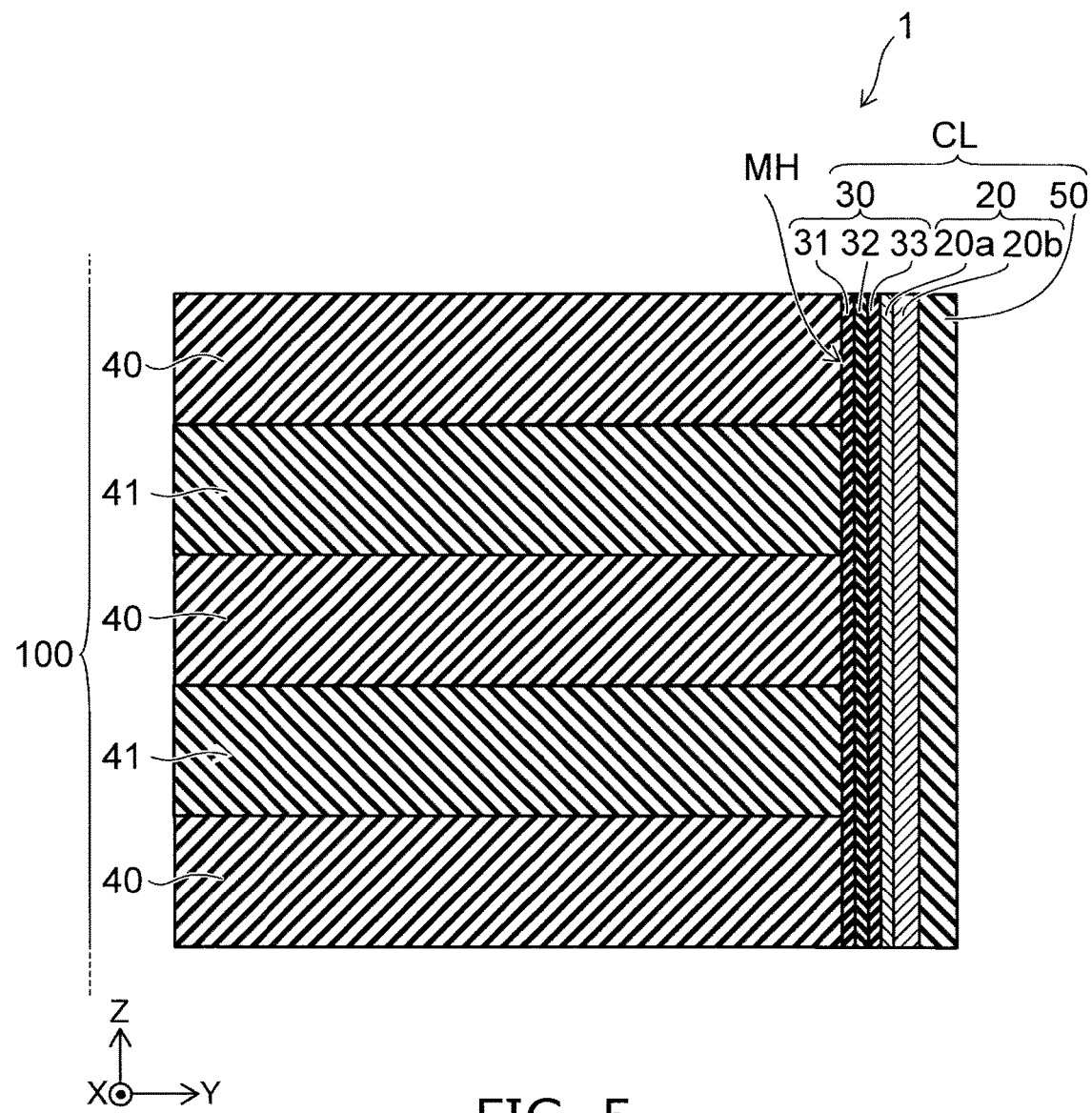
FIG. 5 to FIG. 11 are schematic cross-sectional views showing the method for manufacturing the semiconductor device of the first embodiment.

The stage where the columnar portion CL is formed in the stacked body 100 is shown in FIG. 5. The stacked body 100 at the stage shown in FIG. 5 is in the state in which a replacement member 41 is formed between the insulator 40 and the insulator 40. The replacement member 41 is a layer that is replaced with the electrode layers (SGD, WL, and SGS) subsequently. The material of the replacement member 41 is selected from a material that is different from the insulator 40 and can provide etching selectivity with respect to the insulator 40. For example, silicon nitride is selected as the replacement member 41 when silicon oxide is selected as the insulator 40.

Figure 6:
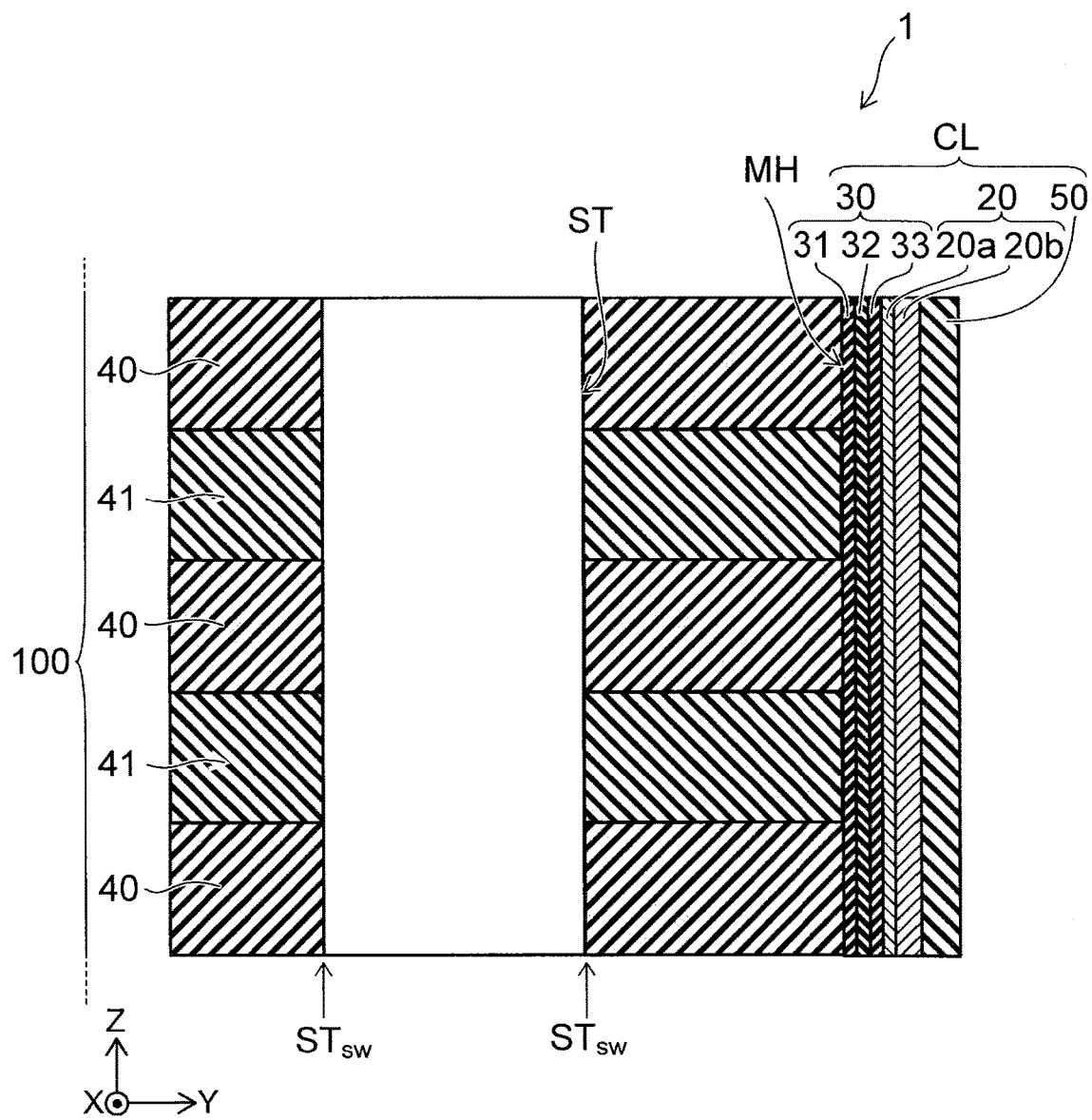

Then, as shown in FIG. 6, the slit ST is made in the stacked body 100. For example, the slit ST is made by anisotropic etching of the stacked body 100. The insulator 40 and the replacement member 41 are exposed alternately at a sidewall $ST_{SW}$ of the slit ST. For example, reactive ion etching (RIE) is an example of the anisotropic etching.

Figure 7:
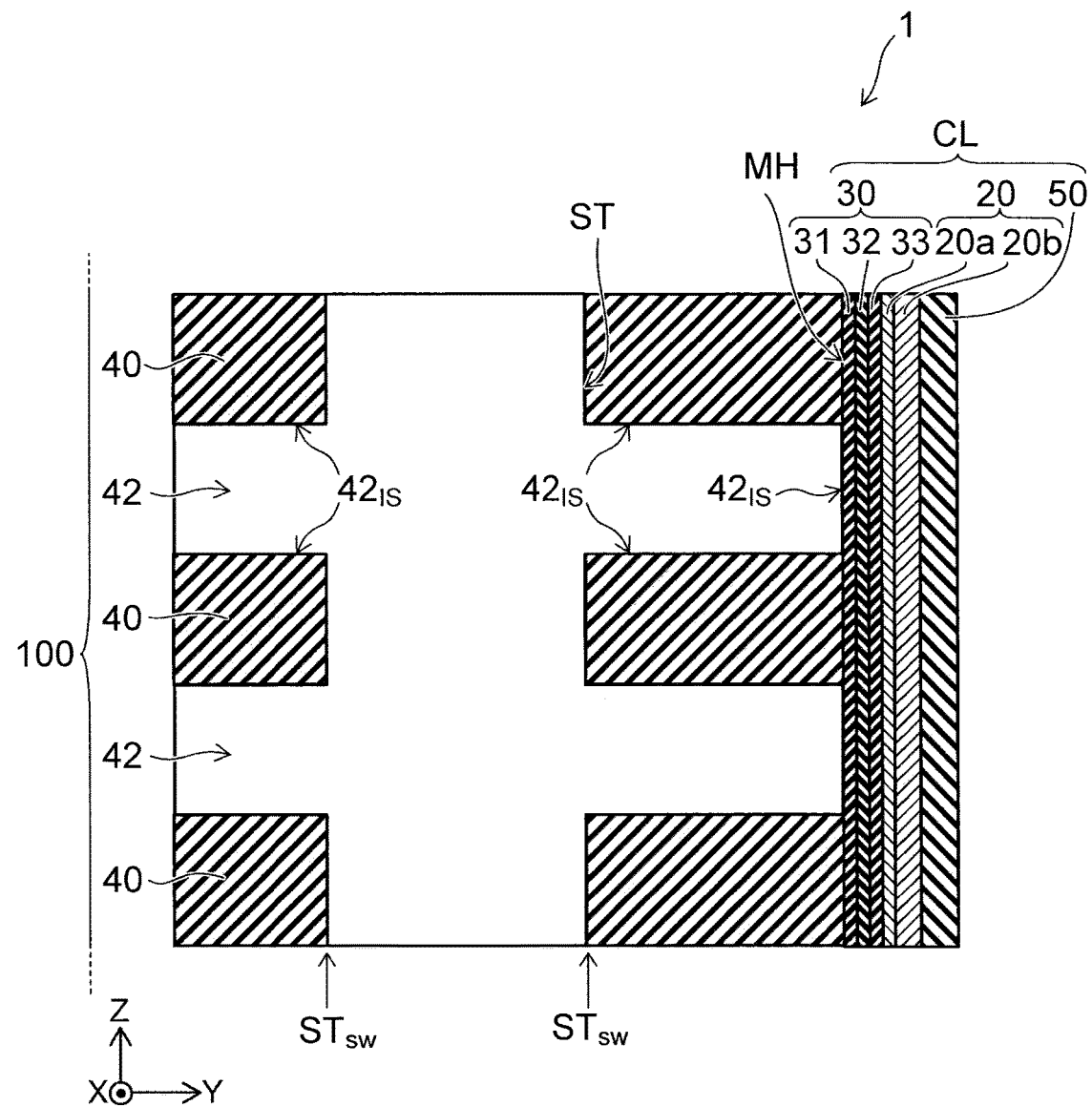

Then, as shown in FIG. 7, the replacement member 41 is removed via the slit ST. Thereby, a space 42 is made between the insulator 40 and the insulator 40. The insulator 40 and the memory film 30 are exposed in the interior of the space 42. In the first embodiment, for example, the insulator 40 and the cover insulating film 31 are exposed in the interior of the space 42. In the specification hereinbelow, the surface that is exposed in the interior of the space 42 is called an inner surface $42_{IS}$ of the space 42.

Figure 8:
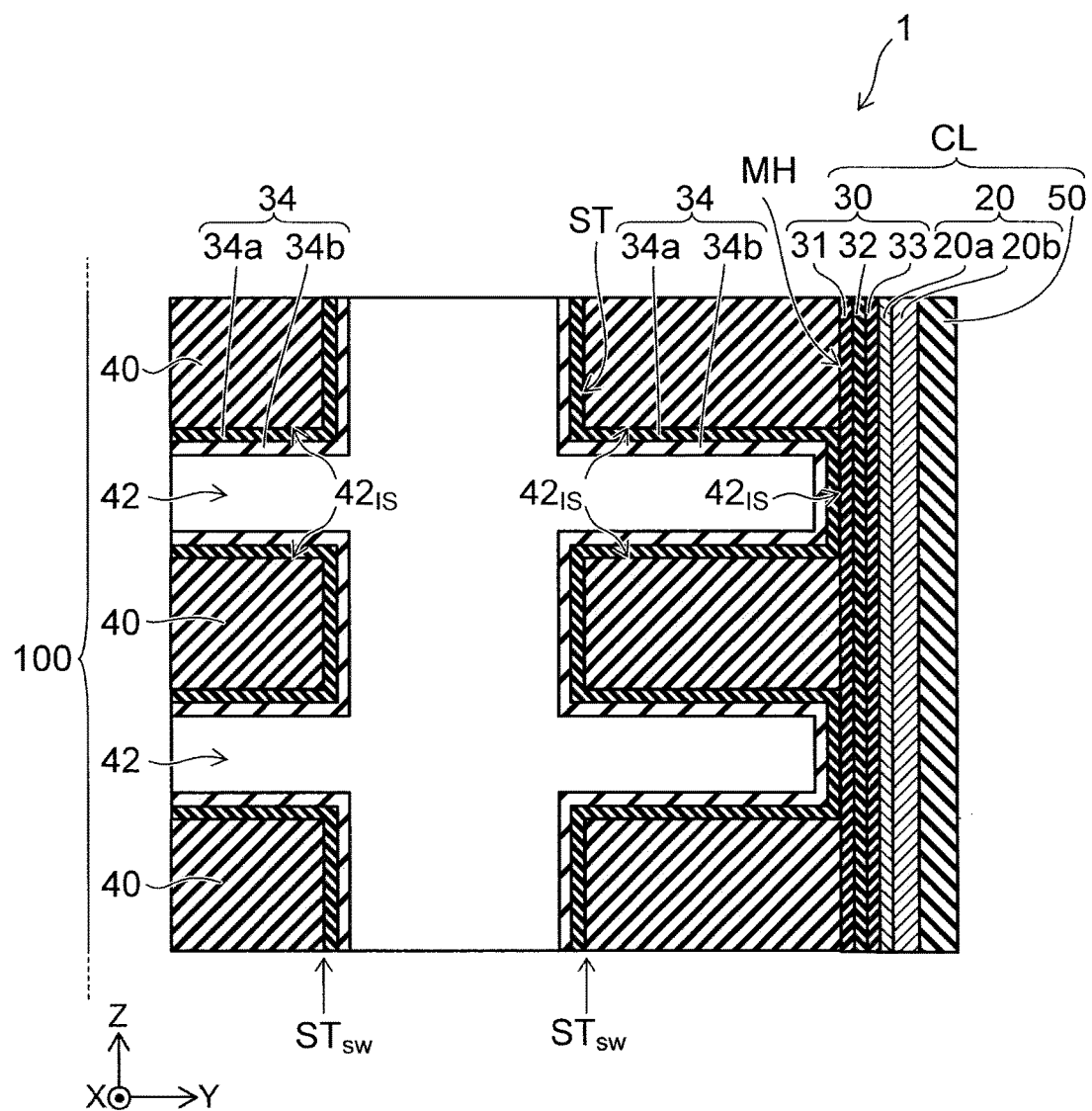

Then, as shown in FIG. 8, the first blocking insulating layer 34a is formed via the slit ST on the insulator 40 exposed at the sidewall $ST_{SW}$, and the insulator 40 exposed at the inner surface $42_{IS}$. The first blocking insulating layer 34a includes, for example, silicon oxide. Then, the second blocking insulating layer 34b is formed via the slit ST on the first blocking insulating layer 34a. The second blocking insulating layer 34b includes, for example, aluminum oxide. Thereby, the blocking insulating film 34 is formed on the insulator 40 exposed at the sidewall of the slit ST, and the insulator 40 exposed at the interior of the space 42.

Figure 9:
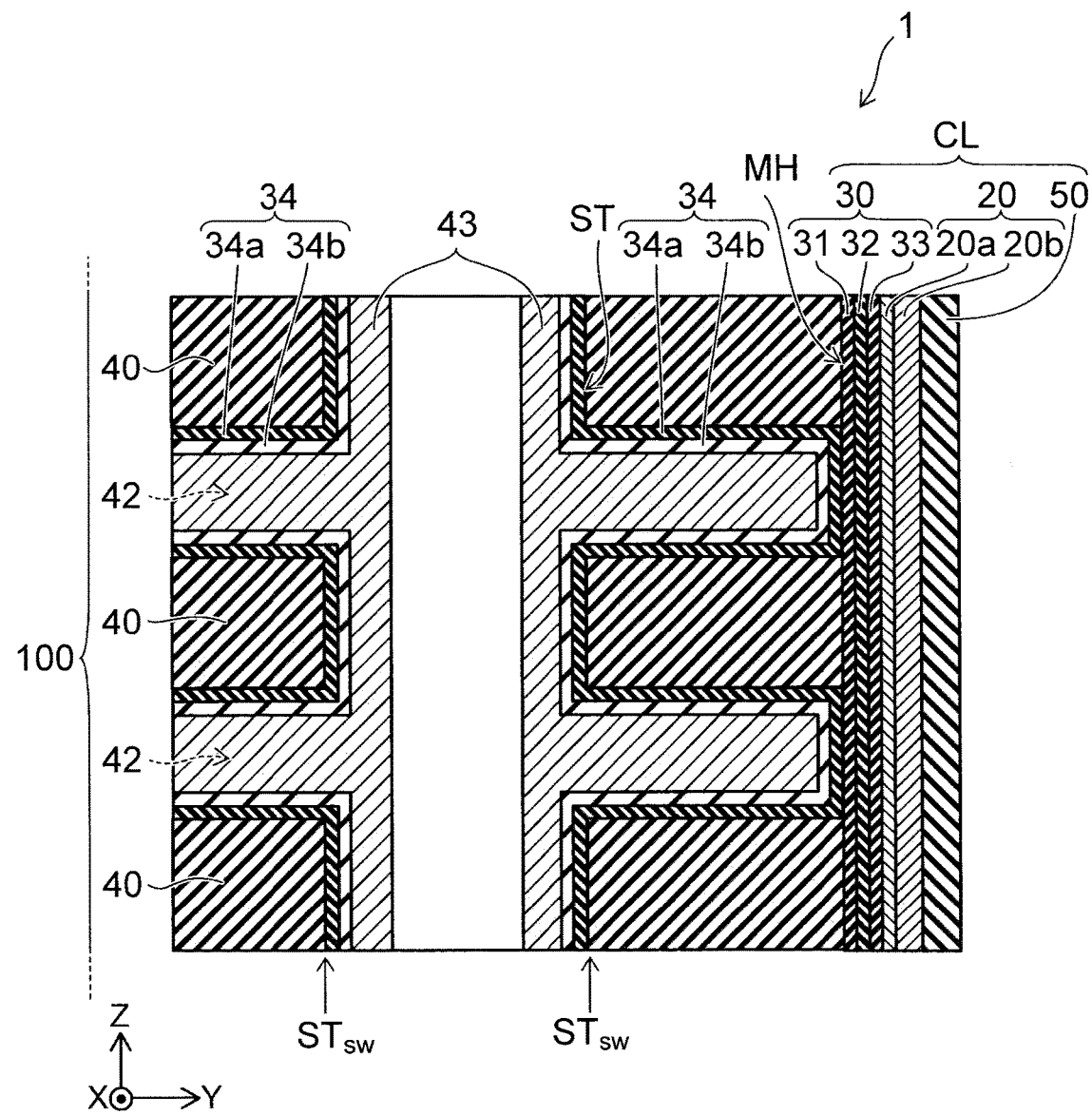

Then, as shown in FIG. 9, a conductor 43 is formed via the slit ST on the blocking insulating film 34. Thereby, the interior of the space 42 is filled with the conductor 43. The conductor 43 includes, for example, tungsten. In the case where the conductor 43 includes tungsten, a barrier film may be formed on the blocking insulating film 34; and the conductor 43 may be formed on the barrier film. For example, the barrier film includes titanium nitride, or includes titanium nitride and titanium.

Figure 10:
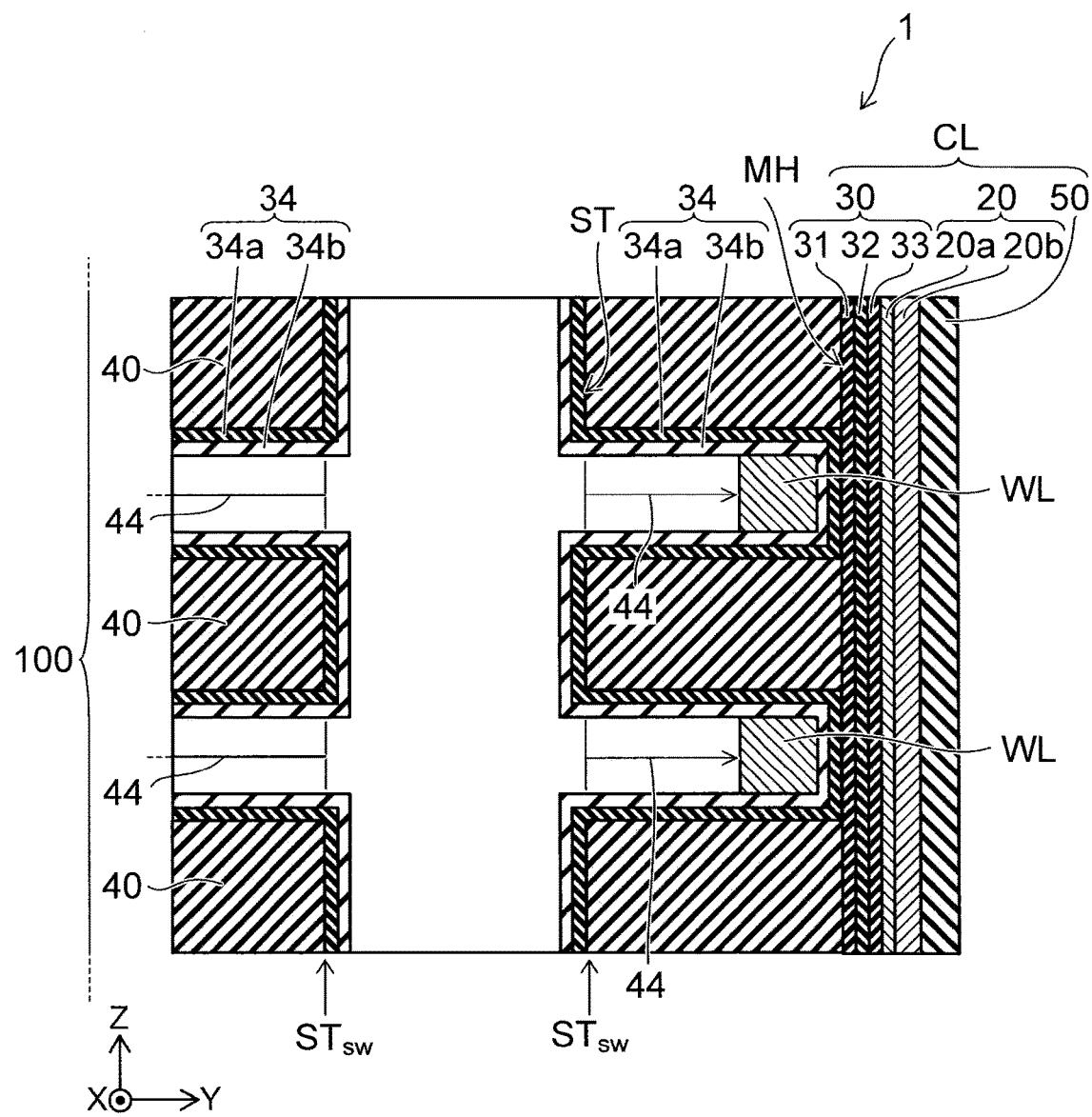

Then, as shown in FIG. 10, the conductor 43 is removed from the interior of the slit ST. Further, the conductor 43 is caused to recede from the sidewall $ST_{SW}$ toward the columnar portion CL. Thereby, a recess portion 44 where the conductor 43 is recessed from the surface of the sidewall $ST_{SW}$ is formed between the insulator 40 and the insulator 40. Also, the conductor 43 is divided every region between the insulator 40 and the insulator 40. Thereby, the electrode layers (SGD, WL, and SGS) are formed. The electrode layers that are used to form the word lines WL are shown in FIG. 10.

Figure 11:
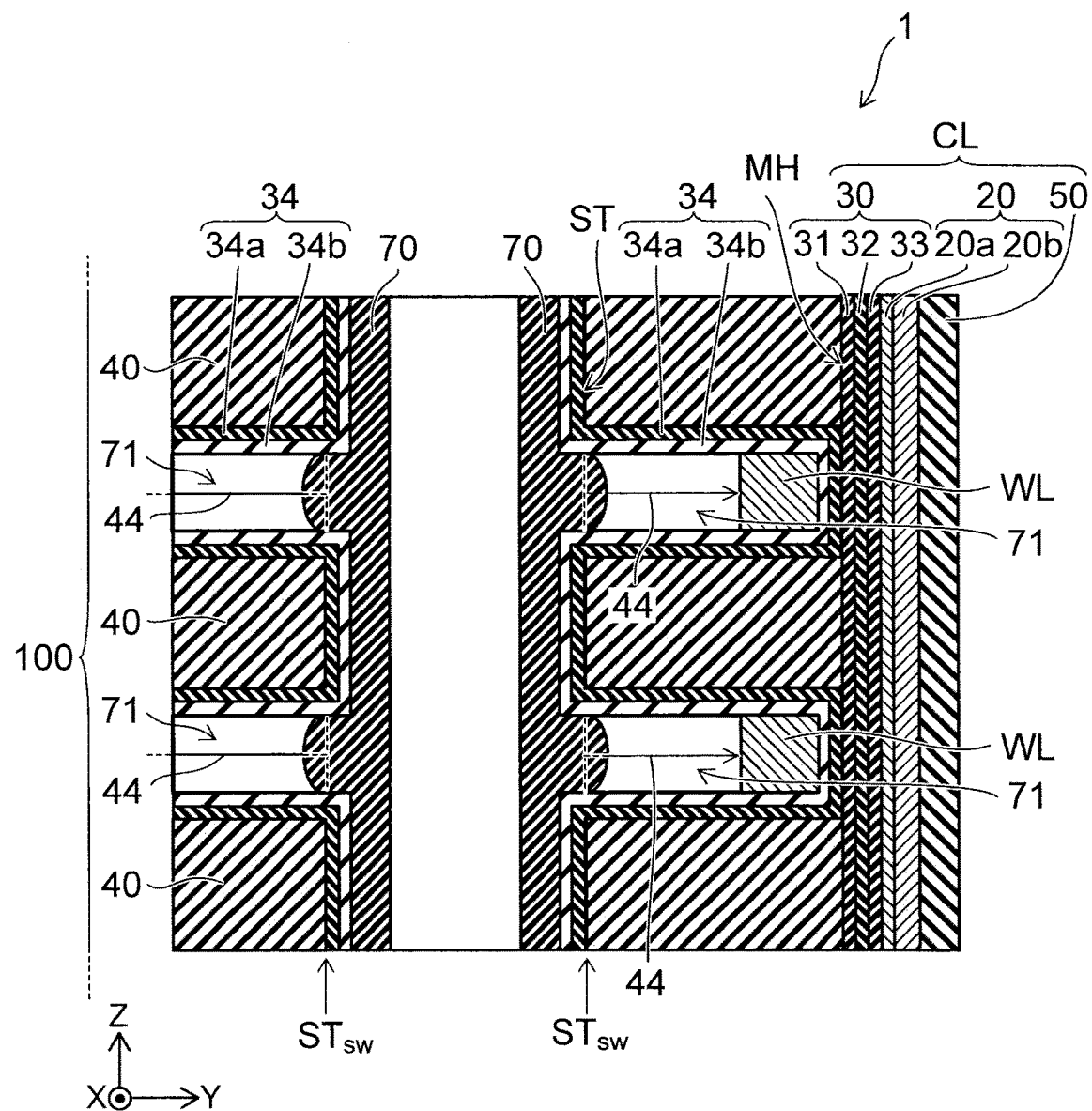

Then, as shown in FIG. 11, the sidewall insulating film 70 is formed on the blocking insulating film 34 on the sidewall $ST_{SW}$. The formation of the sidewall insulating film 70 is performed using conditions at which the recess portion 44 is not filled completely. Thereby, the air gap 71 is made between the sidewall insulating film 70 and the electrode layers (SGD, WL, and SGS). The sidewall insulating film 70 includes, for example, silicon oxide. Then, the bottom portion of the sidewall insulating film 70 is etched. Thereby, the substrate 10 is exposed at the bottom of the slit ST (e.g., referring to FIG. 3).

Then, as shown in FIG. 4, the interior of the slit ST is filled with a conductor by forming the conductor on the sidewall insulating film 70 and on the substrate 10 exposed at the bottom of the slit ST. Thereby, for example, the source line SL is formed in the interior of the slit ST. Then, the plate portion PT that includes the sidewall insulating film 70 and the source line SL is formed in the interior of the slit ST.

For example, the semiconductor device of the first embodiment can be manufactured by such a manufacturing method.

Second Embodiment

Figure 12:
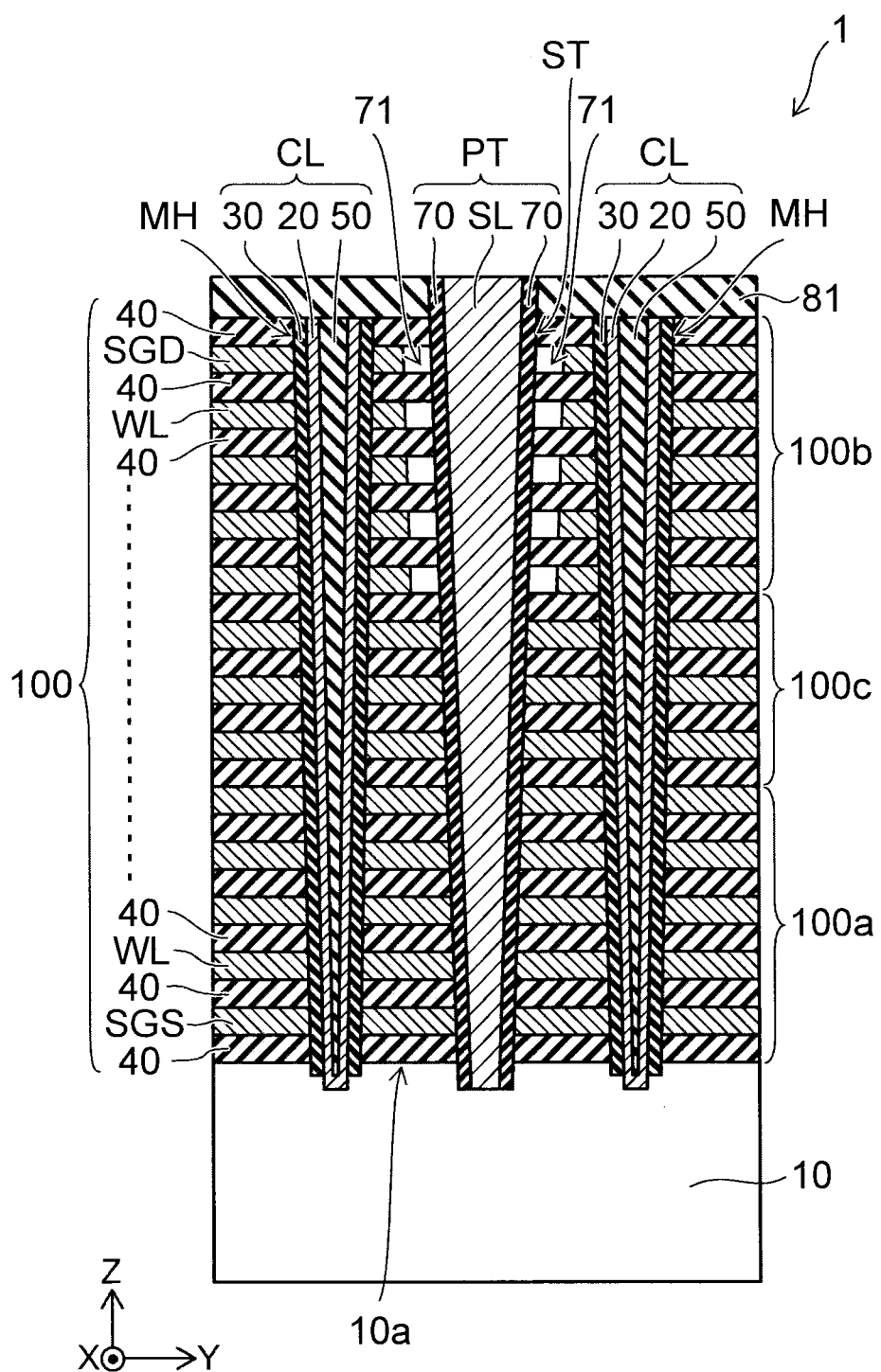
FIG. 12 is a schematic cross-sectional view of the memory cell array of a semiconductor device of a second embodiment.

FIG. 12 is a schematic cross-sectional view of the memory cell array 1 of a semiconductor device of a second embodiment. FIG. 12 corresponds to the cross section shown in FIG. 3.

As shown in FIG. 12, the second embodiment differs from the first embodiment in that the air gap 71 is provided between the sidewall insulating film 70 and a portion of the electrode layers from the lowermost electrode layer (e.g., the source-side selection gate line SGS) to the uppermost electrode layer (e.g., the drain-side selection gate line SGD).

The stacked body 100 includes, for example, a lower layer portion 100a and an upper layer portion 100b. The lower layer portion 100a includes the lowermost electrode layer (SGS). The upper layer portion 100b includes the uppermost electrode layer (SGD). The number of electrode layers (SGS and WL) included in the lower layer portion 100a is arbitrary. Similarly, the number of electrode layers (SGD and WL) included in the upper layer portion 100b is arbitrary. An intermediate layer portion 100c may be included between the lower layer portion 100a and the upper layer portion 100b; or only the two portions of the lower layer portion 100a and the upper layer portion 100b may be included.

The air gap 71 is provided in the upper layer portion 100b in the second embodiment. For example, the advantage of the air gap 71 provided in the upper layer portion 100b will now be described using FIG. 13 and FIG. 14.

Figure 13:
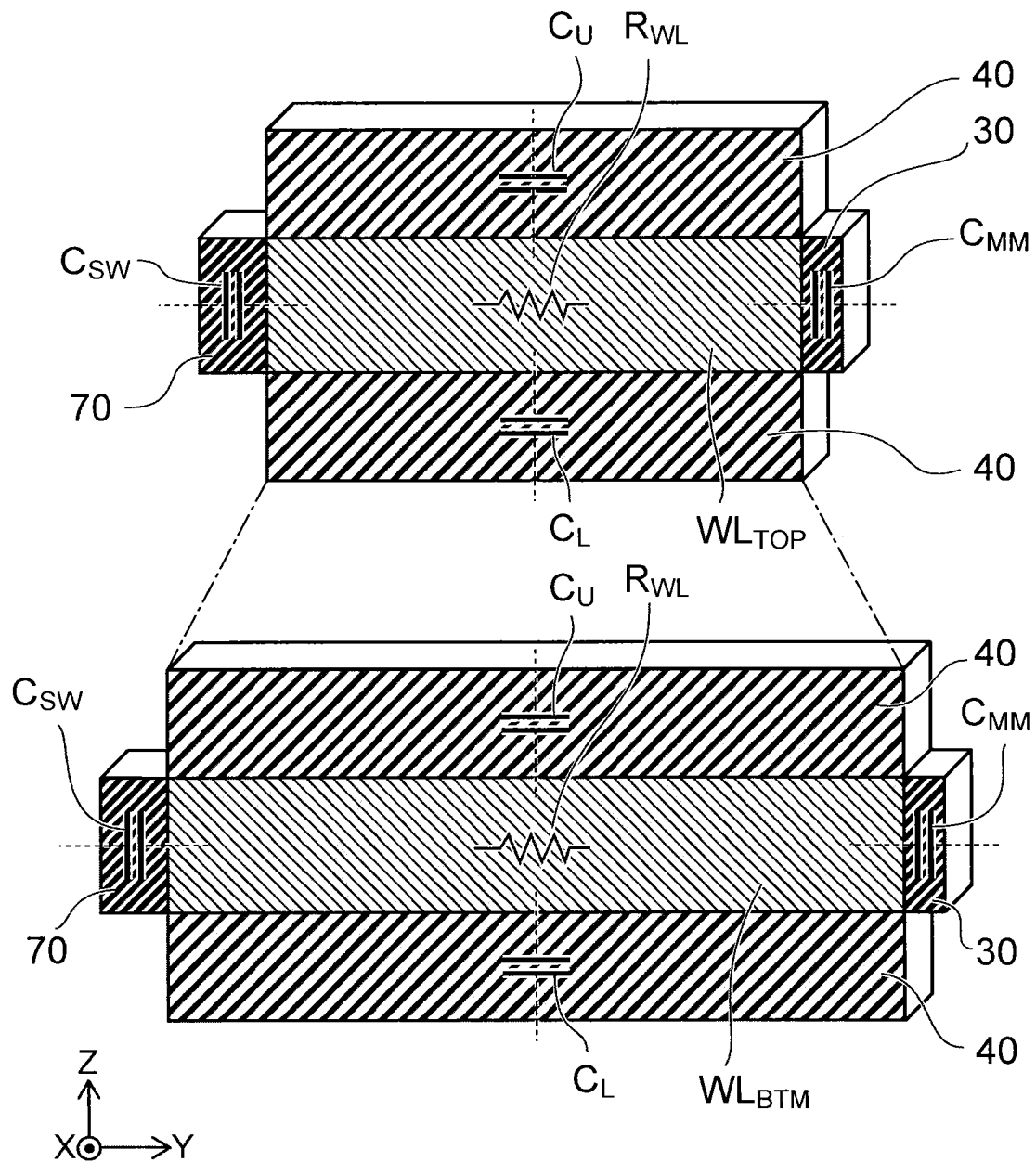
FIG. 13 is a schematic cross-sectional view showing the word lines of a reference example.

FIG. 13 is a schematic cross-sectional view showing the word lines WL of a reference example.

As shown in FIG. 13, basically, parasitic capacitances $C_U$, $C_L$, $C_{SW}$, and $C_{MM}$ exist at the periphery of the word line WL. The parasitic capacitance $C_U$ causes the insulator 40 as a dielectric; and the insulator 40 is provided above the word line WL. The parasitic capacitance $C_L$ causes the insulator 40 as a dielectric; and the insulator 40 is provided below the word line WL. The parasitic capacitance $C_{SW}$ causes the sidewall insulating film 70 as a dielectric. The parasitic capacitance $C_{MM}$ causes the memory film 30 as a dielectric. A parasitic capacitance $C_{WL}$ of the word line WL of the reference example is $$C_{WL}=C_U+C_L+C_{SW}+C_{MM}.$$

For example, the width of the slit ST and the diameter of the memory hole MH are wide at the upper layers of the stacked body 100 and become narrow toward the lower layers. Also, the length of the word line WL between the sidewall insulating film 70 and the memory film 30 along the Y-direction is short at the upper layers of the stacked body 100 and is longer toward the lower layers of the stacked body 100. Therefore, for example, the surface area of the word line WL in the XY plane is large at a lowermost word line $WL_{BTM}$ and small at an uppermost word line $WL_{TOP}$. Accordingly, the parasitic capacitance $C_{WL}$ is different between, for example, the lowermost word line $WL_{BTM}$ and the uppermost word line $WL_{TOP}$.

The lowermost word line $WL_{BTM}$ is the word line that is most proximal to the major surface 10a of the substrate 10. Hereinbelow, the lowermost word line $WL_{BTM}$ is called the bottom word line $WL_{BTM}$. The uppermost word line $WL_{TOP}$ is the word line that is most distal to the major surface 10a of the substrate 10. Hereinbelow, the uppermost word line $WL_{TOP}$ is called the top word line $WL_{TOP}$.

Because the surface areas of the word lines WL in the XY plane are different, the cross-sectional areas along the stacking direction of the word lines WL (the Z-direction) also are different. The cross-sectional area is large at the bottom word line $WL_{BTM}$ and small at the top word line $WL_{TOP}$. Therefore, a resistance value $R_{WL}$ of the word line WL is different between the bottom word line $WL_{BTM}$ and the top word line $WL_{TOP}$. For example, the resistance value $R_{WL}$ of the word line WL is higher for the top word line $WL_{TOP}$ than for the bottom word line $WL_{BTM}$.

Thus, the parasitic capacitance $C_{WL}$ of the word line WL is different between the bottom word line $WL_{BTM}$ and the top word line $WL_{TOP}$. The resistance value $R_{WL}$ of the word line WL also is different between the bottom word line $WL_{BTM}$ and the top word line $WL_{TOP}$. Accordingly, an RC time constant $\tau_{WL}$ of the word line WL ($\tau_{WL}=R_{WL}\times C_{WL}$) is different between the bottom word line $WL_{BTM}$ and the top word line $WL_{TOP}$.

The RC time constant $\tau_{WL}$ of the word line WL is larger for the top word line $WL_{TOP}$ than for the bottom word line $WL_{BTM}$. In other words, the signal response characteristics of the bottom word line $WL_{BTM}$ are better than the signal response characteristics of the top word line $WL_{TOP}$.

Figure 14:
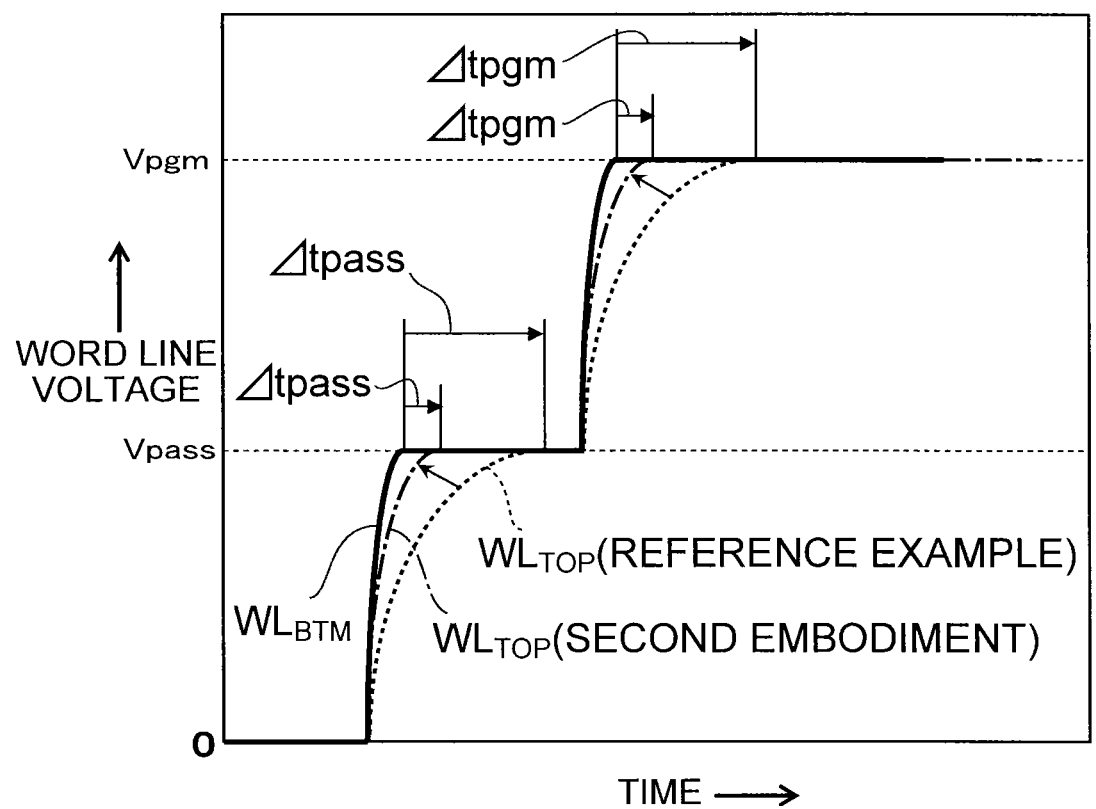
FIG. 14 is a schematic view showing the relationship between the word line voltage and time.

FIG. 14 is a schematic view showing the relationship between the word line voltage and time.

As shown in FIG. 14, for example, in the programming operation, the time to reach a pass voltage Vpass from, for example, 0 V is faster for the bottom word line $WL_{BTM}$ than for the top word line $WL_{TOP}$. The time difference is taken as Δtpass. Similarly, the time to reach a programming voltage Vpgm from the pass voltage Vpass also is faster for the bottom word line $WL_{BTM}$ than for the top word line $WL_{TOP}$. The time difference is taken as Δtpgm.

When the fluctuation of the time difference Δtpass and/or the fluctuation of the time difference Δtpgm are too large, for example, this may cause program disturbance and/or pass disturbance in the programming operation. For example, it is assumed that the voltage increase rate of the program pulse and the like are optimized to match the electrical characteristics of the top word line $WL_{TOP}$ where the RC time constant $\tau_{WL}$ is large. Then, the bottom word line $W_{BTM}$ where the RC time constant $\tau_{WL}$ is small easily has excessive performance. Therefore, when the programming voltage Vpgm is applied to the bottom word line $WL_{BTM}$, there is a possibility that a large electric field may be generated instantaneously between the bottom word line $WL_{BTM}$ and the channel of a memory cell for which the threshold voltage is not to be shifted, e.g., a memory cell MC for which the data of "1" is to be maintained. Regardless of the threshold voltage not being shifted, a phenomenon is caused in which electrons are undesirably trapped in the memory film. This is program disturbance. Also, even in the case where the bottom word line $WL_{BTM}$ is set to the pass voltage, there is a possibility that a large electric field may be generated. This also causes the phenomenon of the electrons being undesirably trapped in the memory film. This is pass disturbance.

The program disturbance and the pass disturbance are both misprogramming. When the program disturbance or the pass disturbance occur, the threshold voltage of the memory cell MC shifts little by little in the high direction. Finally, for example, in binary memory, the data of "1 (the erase state)" changes to the data of "0 (the program state)." Also, in multi-bit memory, the threshold voltage range that corresponds to the data shifts to a range that is one level higher. As a result, for example, in quaternary memory, the data of "11 (the erase state)" changes to the data of "10;" the data of "10" changes to the data of "01;" and the data "01" changes to the data of "00."

Figure 15:
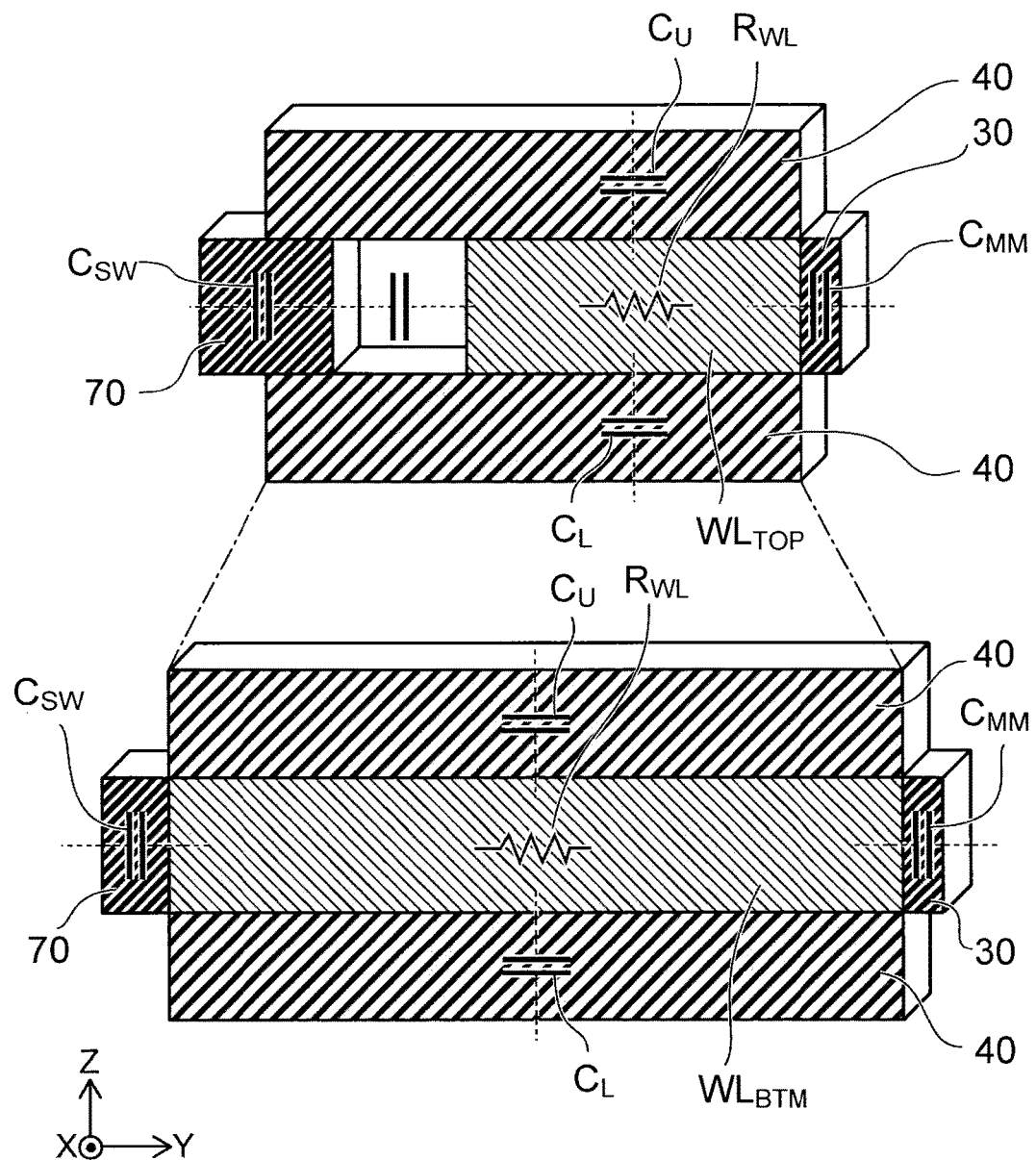
FIG. 15 is a schematic cross-sectional view showing the word lines of the second embodiment.

FIG. 15 is a schematic cross-sectional view showing the word lines WL of the second embodiment.

In the second embodiment as shown in FIG. 15, the structure of the periphery of the bottom word line $WL_{BTM}$ is, for example, similar to that of the reference example. However, the structure of the periphery of the top word line $WL_{TOP}$ is different from that of the reference example. For example, in the second embodiment, the air gap 71 is between the top word line $WL_{TOP}$ and the sidewall insulating film 70. The parasitic capacitance having the air gap 71 as a dielectric is "$C_{AG}$." A parasitic capacitance $C_{AG}$ is connected in series to the parasitic capacitance $C_{SW}$. The parasitic capacitance $C_{WL}$ of the word line WL of the second embodiment is $$C_{WL}=C_U+C_L+(C_{SW}\times C_{AG}/(C_{SW}+C_{AG}))+C_{MM}.$$

The parasitic capacitances $C_{SW}$ and $C_{MM}$ are taken to be respectively equal between the reference example and the second embodiment. For the parasitic capacitances $C_U$ and $C_L$, the length of the top word line $WL_{TOP}$ is shorter by the amount of the air gap 71. Therefore, these are smaller for the second embodiment than for the reference example. In the second embodiment, the parasitic capacitance $C_{SW}$ becomes even smaller due to the series connection with the parasitic capacitance $C_{AG}$.

The resistance value $R_{WL}$ of the top word line $WL_{TOP}$ of the second embodiment is higher than that of the reference example. However, the second embodiment includes, for example, the air gap 71 between the sidewall insulating film 70 and the top word line $WL_{TOP}$. Therefore, it is possible to adjust both the parasitic capacitance $C_{AG}$ and the resistance value $R_{WL}$ of the top word line $WL_{TOP}$. By adjusting both the parasitic capacitance $C_{AG}$ and the resistance value $R_{WL}$, for example, the parasitic capacitance $C_{WL}$ of the top word line $WL_{TOP}$ is reduced. Thereby, for example, the RC time constant $T_{WL}$ of the top word line $WL_{TOP}$ can be smaller than the RC time constant $\tau_{WL}$ of the top word line $WL_{TOP}$ of the reference example.

According to such a second embodiment, for example, the air gap 71 is provided only in the upper layer portion 100b of the stacked body 100. Therefore, in the upper layer portion 100b, the RC time constant $\tau_{WL}$ of the word line WL that is adjacent to the sidewall insulating film 70 with the air gap 71 interposed can be selectively reduced. Therefore, as shown in FIG. 14, for example, compared to the reference example, the RC time constant $\tau_{WL}$ of the top word line $WL_{TOP}$ can approach the RC time constant $\tau_{WL}$ of the bottom word line $WL_{BTM}$.

Thus, because the difference between the RC time constant $\tau_{WL}$ of the top word line $WL_{TOP}$ and the RC time constant $\tau_{WL}$ of the bottom word line $WL_{BTM}$ can be reduced, compared to the reference example, it is possible to reduce the fluctuation of the time difference Δtpass and/or the fluctuation of the time difference Δtpgm. Accordingly, according to the second embodiment, for example, compared to the reference example, the occurrence of the program disturbance and the pass disturbance in the programming operation can be suppressed better.

In the second embodiment, although the air gap 71 is provided in the upper layer portion 100b, it is also possible to provide the air gap 71 only in the lower layer portion 100a. In the case where the air gap 71 is provided in the lower layer portion 100a, for example, the resistance value $R_{WL}$ of the bottom word line $WL_{BTM}$ is set to be higher by adjusting both the parasitic capacitance $C_{AG}$ and the resistance value $R_{WL}$. Thereby, for example, the RC time constant $\tau_{WL}$ of the bottom word line $WL_{BTM}$ can approach the RC time constant $\tau_{WL}$ of the top word line $WL_{TOP}$.

Thus, for example, compared to the reference example, the fluctuation of the time difference Δtpgm can be reduced by causing the RC time constant $\tau_{WL}$ of the bottom word line $WL_{BTM}$ to approach the RC time constant $\tau_{WL}$ of the top word line $WL_{TOP}$ as well. Accordingly, even in the case where the air gap 71 is provided in the lower layer portion 100a, compared to the reference example, for example, the occurrence of the program disturbance and the pass disturbance in the programming operation can be suppressed better.

Summarizing the first embodiment and the second embodiment recited above, it is sufficient for the air gap 71 to be provided in at least a portion of the stacked body 100.

Third Embodiment

Figure 16:
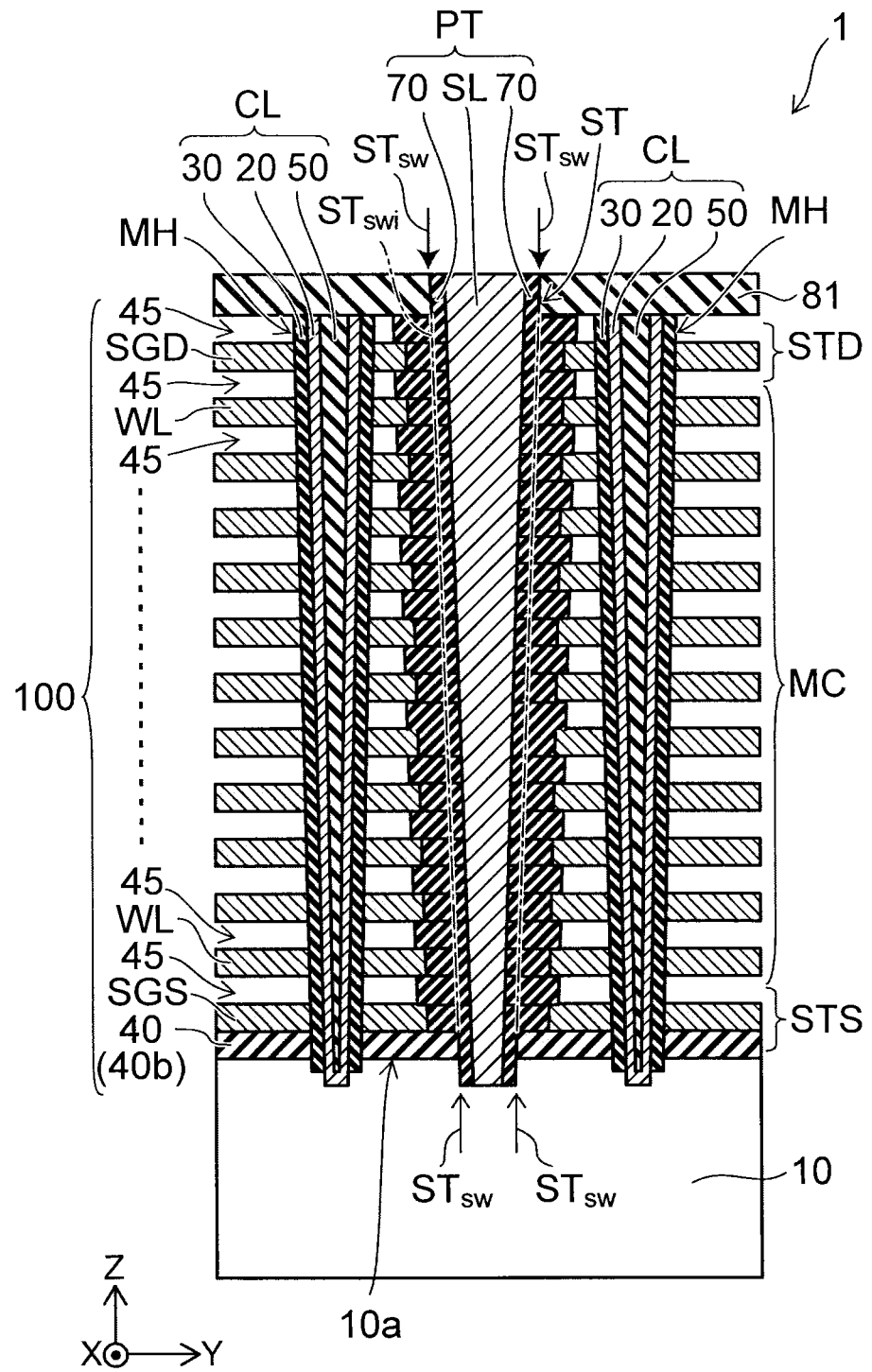
FIG. 16 is a schematic cross-sectional view of the memory cell array of a semiconductor device of a third embodiment.
Figure 17:
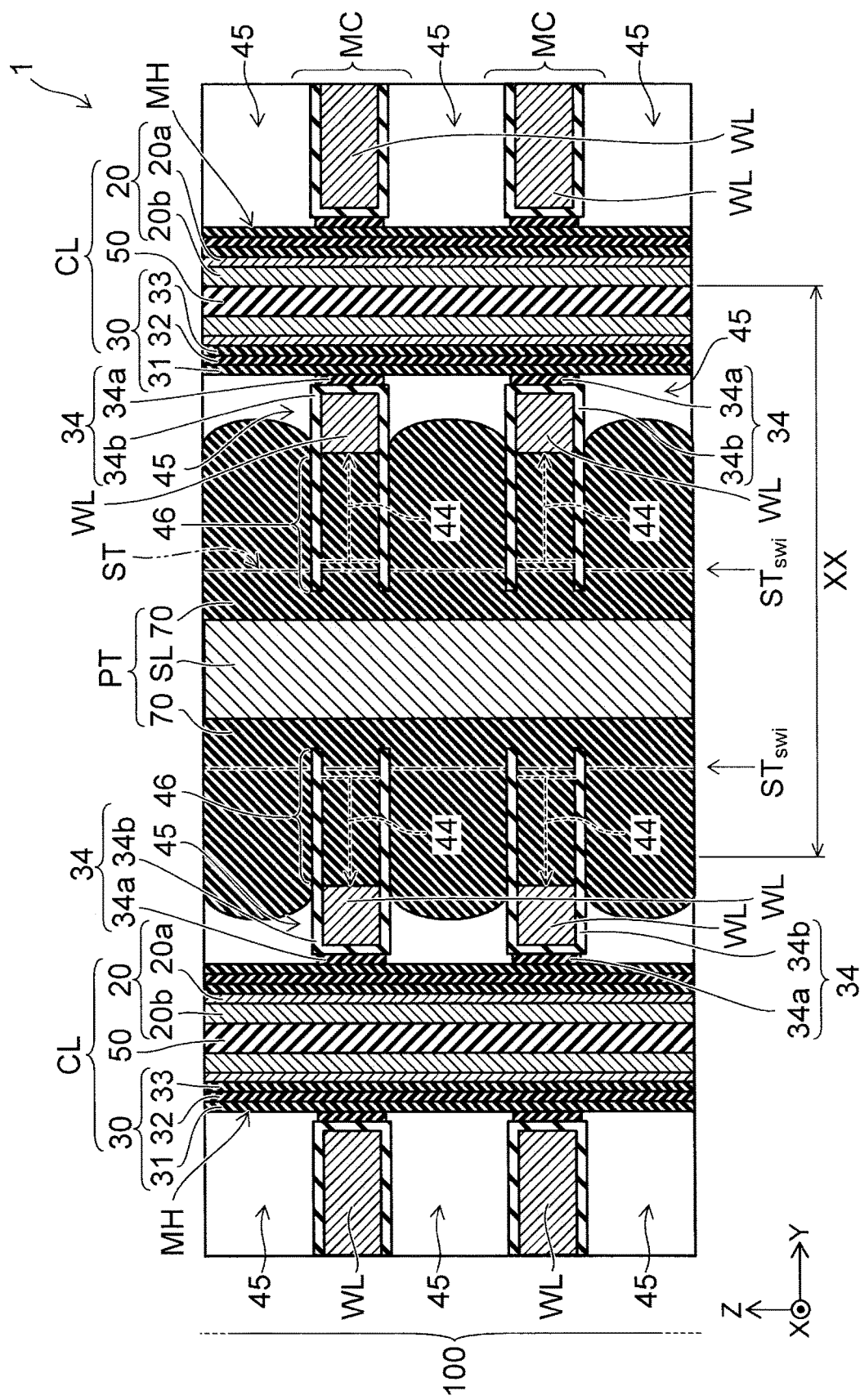
FIG. 17 is a schematic cross-sectional view in which the cross section shown in FIG. 16 is enlarged.

FIG. 16 is a schematic cross-sectional view of the memory cell array 1 of a semiconductor device of a third embodiment. FIG. 16 corresponds to the cross section shown in FIG. 3. FIG. 17 is a schematic cross-sectional view in which the cross section shown in FIG. 16 is enlarged. FIG. 17 shows the extracted intermediate portion of the stacked body 100. The schematic cross section of the memory cell MC is shown in FIG. 17.

As shown in FIG. 16 and FIG. 17, the third embodiment differs from the first embodiment in that the insulator 40 of the stacked body 100 is replaced with an air gap 45. Thereby, the stacked body 100 of the third embodiment includes the electrode layers (SGD, WL, and SGS) stacked with the air gap 45 interposed.

The insulator 40 (a lower-layer insulator 40b) that is formed on the major surface 10a of the substrate 10 and the insulating film 81 that is formed on the stacked body 100 remain as-is and are not air gaps. For example, the lower-layer insulator 40b is used to form the gate insulator film of the source-side selection transistor STS. Therefore, a material that can provide etching selectivity with respect to each of the insulator 40 and the replacement member 41 is selected as the lower-layer insulator 40b and the insulating film 81. For example, if the insulator 40 is silicon oxide and the replacement member 41 is silicon nitride, materials that are different from silicon oxide and silicon nitride are selected as the lower-layer insulator 40b and the insulating film 81. An example of such a material is an insulative silicon compound including carbon. For example, SiOC, SiCN, SiOCN, etc., may be used.

Also, an insulative silicon compound that is formed using thermal oxidation can be selected as the lower-layer insulator 40b and the insulating film 81. Compared to an insulative silicon compound (e.g., silicon oxide or silicon nitride) that is formed using CVD, for example, the insulative silicon compound that is formed using thermal oxidation has strong wet etching resistance. One reason the wet etching resistance is strong is because, for example, the "density" of the film improves more by performing the thermal oxidation than for a film formed by only CVD. For example,

- $SiO_2$ (a thermal oxide film) formed by thermal oxidation of single crystalline Si or CVD-Si
- $SiO_2$ formed by further thermal oxidation of CVD-$SiO_2$
- SiON formed by thermal oxidation of CVD-SiN, and
- $SiO_2$ formed by thermal oxidation of CVD-SiN (a silicon compound in which the nitrogen atoms in the CVD-SiN substantially are replaced with oxygen atoms) can be used as the insulative silicon compound formed using thermal oxidation.

Similarly to the first embodiment, the electrode layers (SGD, WL, and SGS) between the plate portion PT and the columnar portion CL are recessed toward the columnar portion CL from the surface of the sidewall $ST_{SW}$ of the slit ST. The sidewall $ST_{SW}$ substantially disappears in the interior of the stacked body 100. However, a trace of the sidewall $ST_{SW}$ of the slit ST remains in the substrate 10 and in the insulating film 81 provided on the stacked body 100.

The position of the sidewall $ST_{SW}$ in the interior of the stacked body 100 can be estimated using the line connecting the sidewall $ST_{SW}$ remaining in the insulating film 81 and the sidewall $ST_{SW}$ remaining in the substrate 10. The estimated position of the sidewall $ST_{SW}$ is illustrated by a double dot-dash line $ST_{SW}$ in FIG. 17. Thereby, similarly to the first embodiment, the stacked body 100 includes the recess portion 44 in which the electrode layers (SGD, WL, and SGS) are recessed toward the columnar portion CL from the plate portion PT along the major surface direction of the substrate 10 (the Y-direction).

The blocking insulating film 34 is provided from the portions between the air gap 45 and the electrode layers (SGD, WL, and SGS) to the portions between the columnar portion CL and the electrode layers (SGD, WL, and SGS). The blocking insulating film 34 includes a protruding portion 46 that protrudes from the columnar portion CL toward the plate portion PT in the recess portion 44. The protruding portion 46 spreads along the major surface 10a direction of the substrate 10. In the third embodiment, the protruding portion 46 includes the second blocking insulating layer 34b. The blocking insulating film 34 includes the second blocking insulating layer 34b and the first blocking insulating layer 34a in the portions between the columnar portion CL and the electrode layers (SGD, WL, and SGS).

Figure 18:
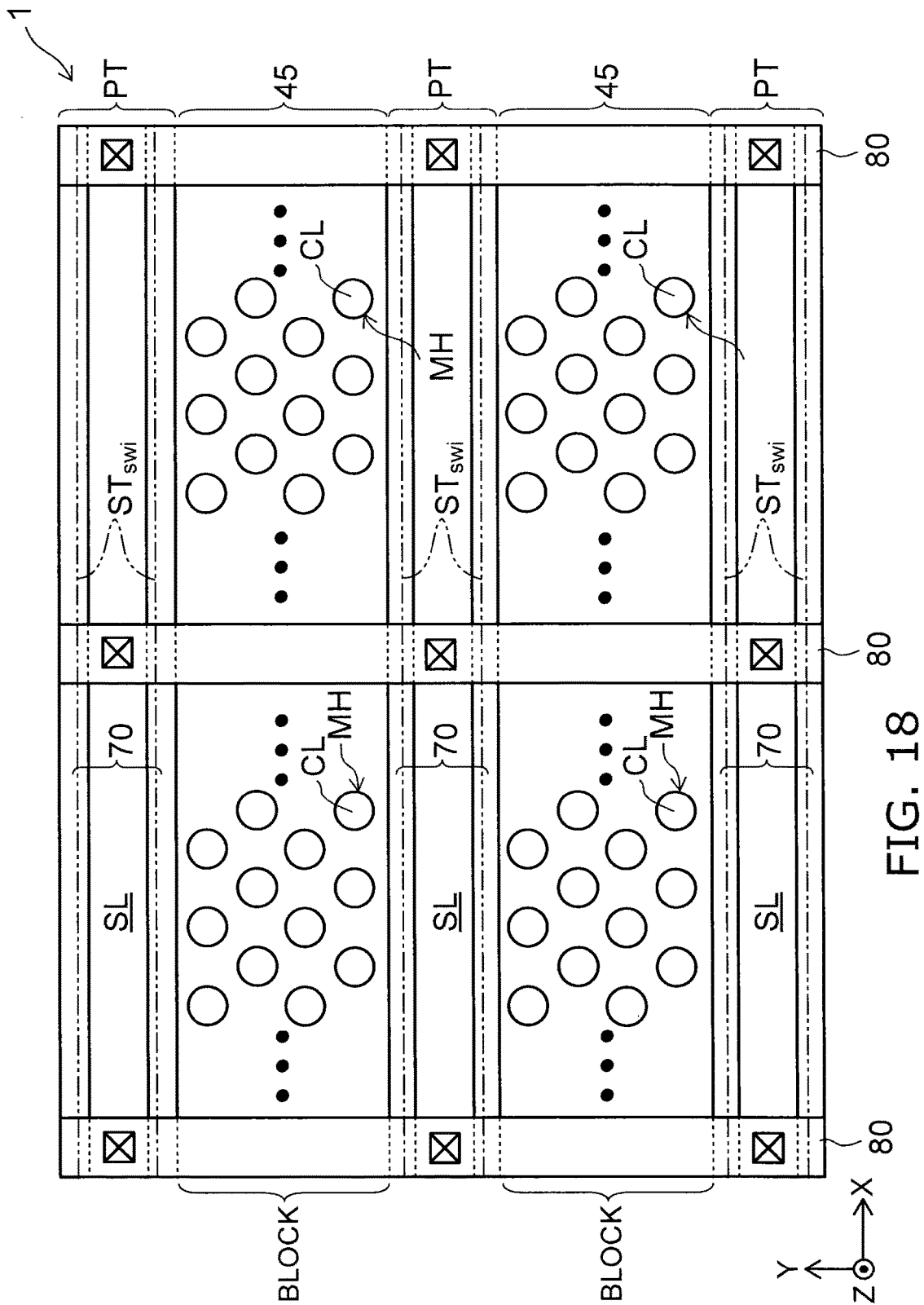
FIG. 18 is a schematic plan view of the memory cell array of the semiconductor device of the third embodiment.

FIG. 18 is a schematic plan view of the memory cell array 1 of the semiconductor device of the third embodiment. The plane of a layer in which the air gap 45 is provided is shown in FIG. 18.

As shown in FIG. 18, for example, the air gap 45 can be provided in the entire region of the region (the block) between the plate portion PT and the plate portion PT. In such a case, in the block, for example, the insulator 40 does not exist; and only the air gap 45 exists along the Y-direction.

Figure 19:
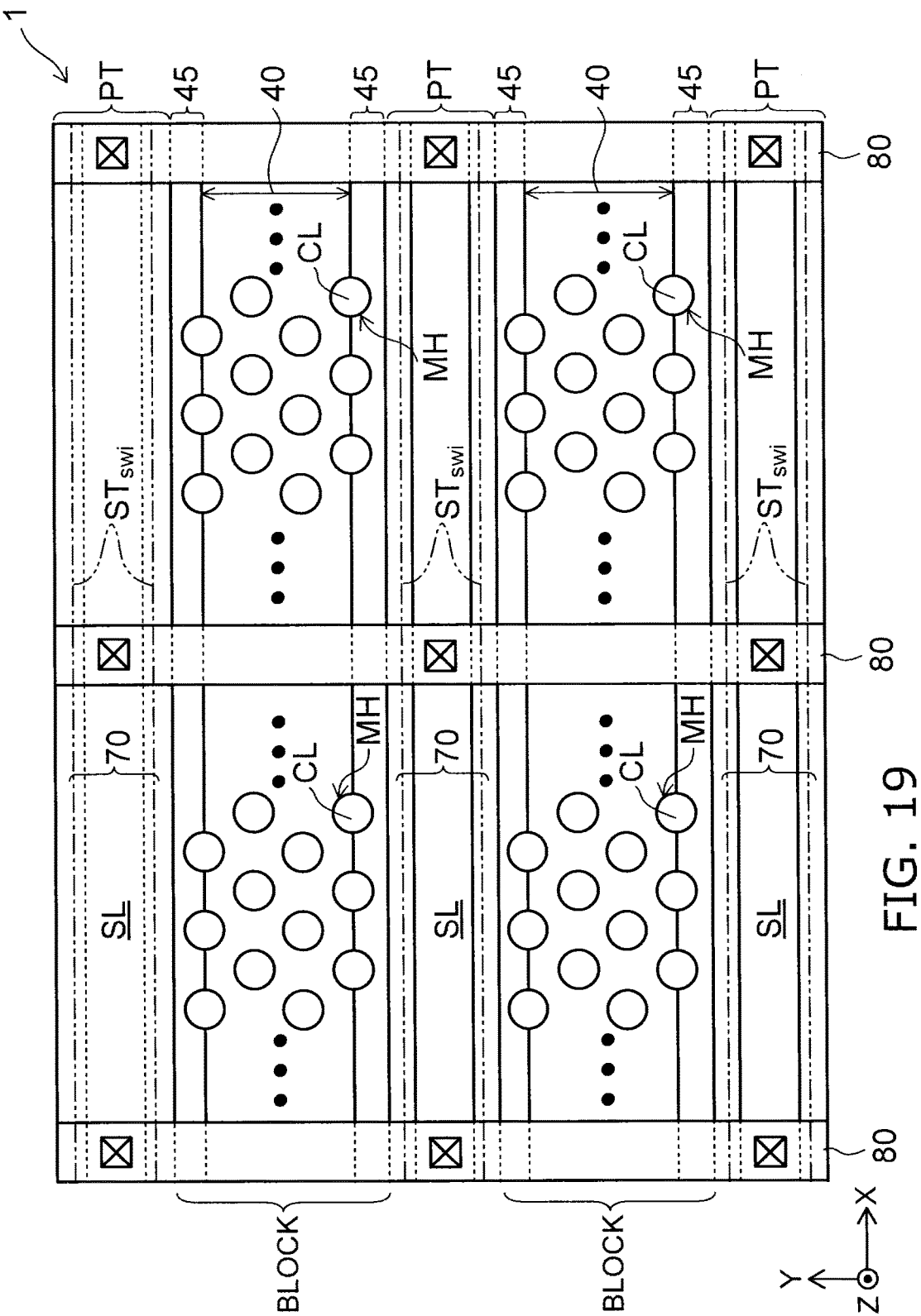
FIG. 19 is a schematic plan view of another example of the memory cell array of the semiconductor device of the third embodiment.

FIG. 19 is a schematic plan view of another example of the memory cell array 1 of the semiconductor device of the third embodiment. The plane of the layer in which the air gap 45 is provided is shown in FIG. 19.

As shown in FIG. 19, in the block, the air gap 45 may be provided in a line configuration in the X-direction along the plate portion PT. In such a case, in the block, the air gap 45 and the insulator 40 exist along the Y-direction. The insulator 40 is provided along the Y-direction between the air gap 45 and the air gap 45.

Thus, the air gap 45 that is included in the semiconductor device of the third embodiment may be provided in the entire region of the block or may be provided in a portion of the block.

According to the third embodiment, the air gap 45 is included along the stacking direction of the stacked body 100 (the Z-direction) between the electrode layer and the electrode layer, e.g., between the word line WL and the word line WL. Therefore, the capacitance between the word line WL and the word line WL is small compared to the case where the air gap 45 is not included. Accordingly, according to the third embodiment, compared to the case where the air gap 45 is not included, the parasitic capacitance $C_{WL}$ of the word line WL can be reduced. The third embodiment in which the parasitic capacitance $C_{WL}$ of the word line WL can be reduced is advantageous for increasing the speed of the operations of the semiconductor device.

A method for manufacturing the semiconductor device of the third embodiment will now be described.

FIG. 20 to FIG. 25 are schematic cross-sectional views showing the method for manufacturing the semiconductor device of the third embodiment. For example, the cross section shown in FIG. 20 to FIG. 25 corresponds to the portion of area XX shown in FIG. 17.

Figure 20:
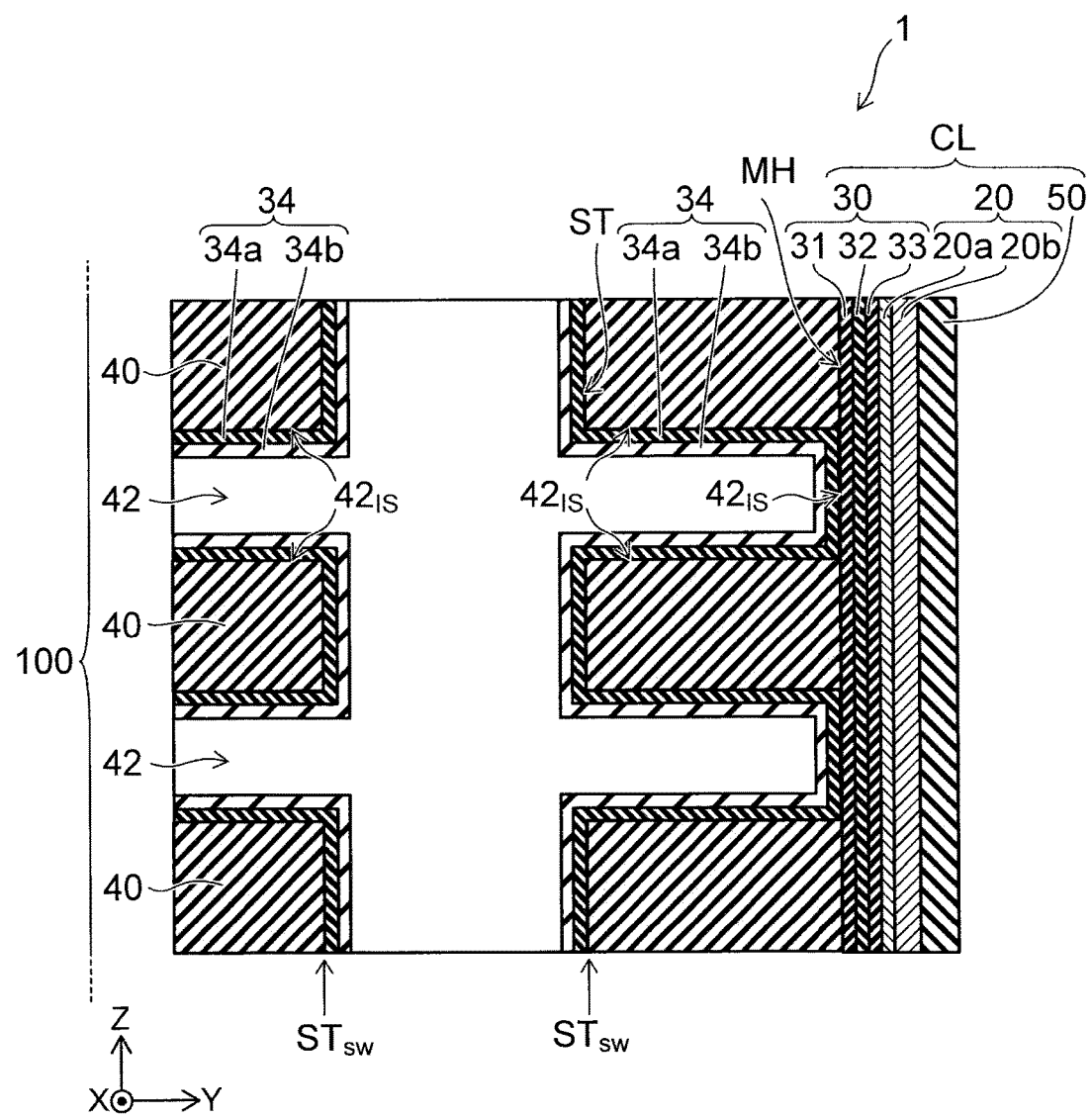
FIG. 20 to FIG. 25 are schematic cross-sectional views showing the method for manufacturing the semiconductor device of the third embodiment.

As shown in FIG. 20, according to the method described in reference to FIG. 5 to FIG. 8, the first blocking insulating layer 34a is formed via the slit ST on the insulator 40 exposed at the sidewall $ST_{SW}$, the insulator 40 exposed at the inner surface $42_{IS}$, and the insulator 40 exposed at the inner surface $42_{IS}$. Then, the second blocking insulating layer 34b is formed via the slit ST on the first blocking insulating layer 34a. Thereby, the blocking insulating film 34 is formed on the insulator 40 exposed at the sidewall of the slit ST, the insulator 40 exposed at the interior of the space 42, and the insulator 40 exposed at the interior of the space 42. The first blocking insulating layer 34a includes, for example, silicon oxide. The second blocking insulating layer 34b includes, for example, a metal oxide. The metal oxide includes, for example, aluminum oxide.

Figure 21:
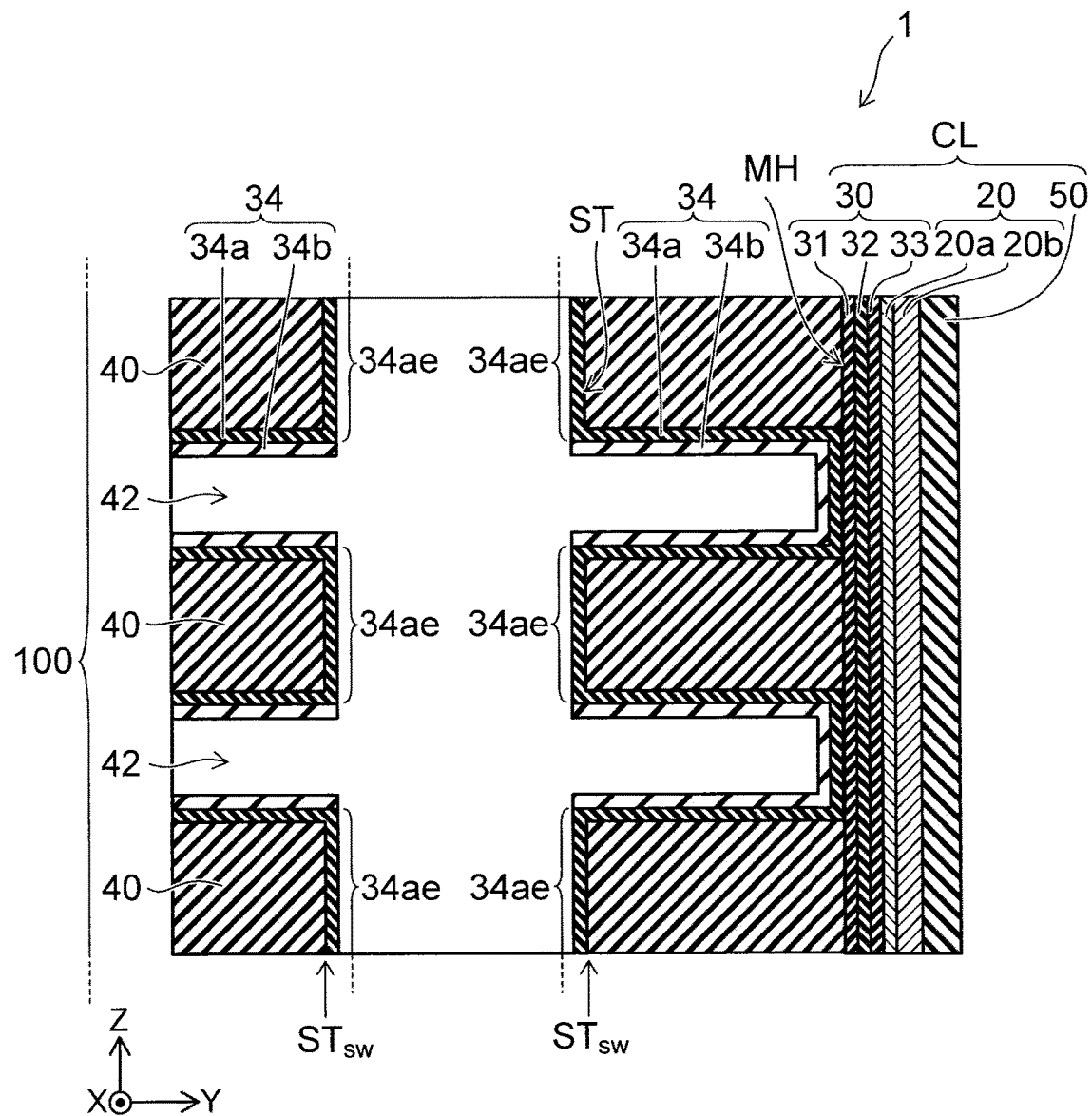

Then, as shown in FIG. 21, the second blocking insulating layer 34b is removed along the sidewall $ST_{SW}$ of the slit ST. Thereby, the first blocking insulating layer 34a is exposed in the interior of the slit ST along the sidewall $ST_{SW}$. In FIG. 21, the exposed surface of the first blocking insulating layer 34a is marked with the reference numeral "34ae." In the process shown in FIG. 21, it is sufficient for anisotropic etching of the second blocking insulating layer 34b via the slit ST to be performed. The anisotropic etching is, for example, RIE.

Figure 22:
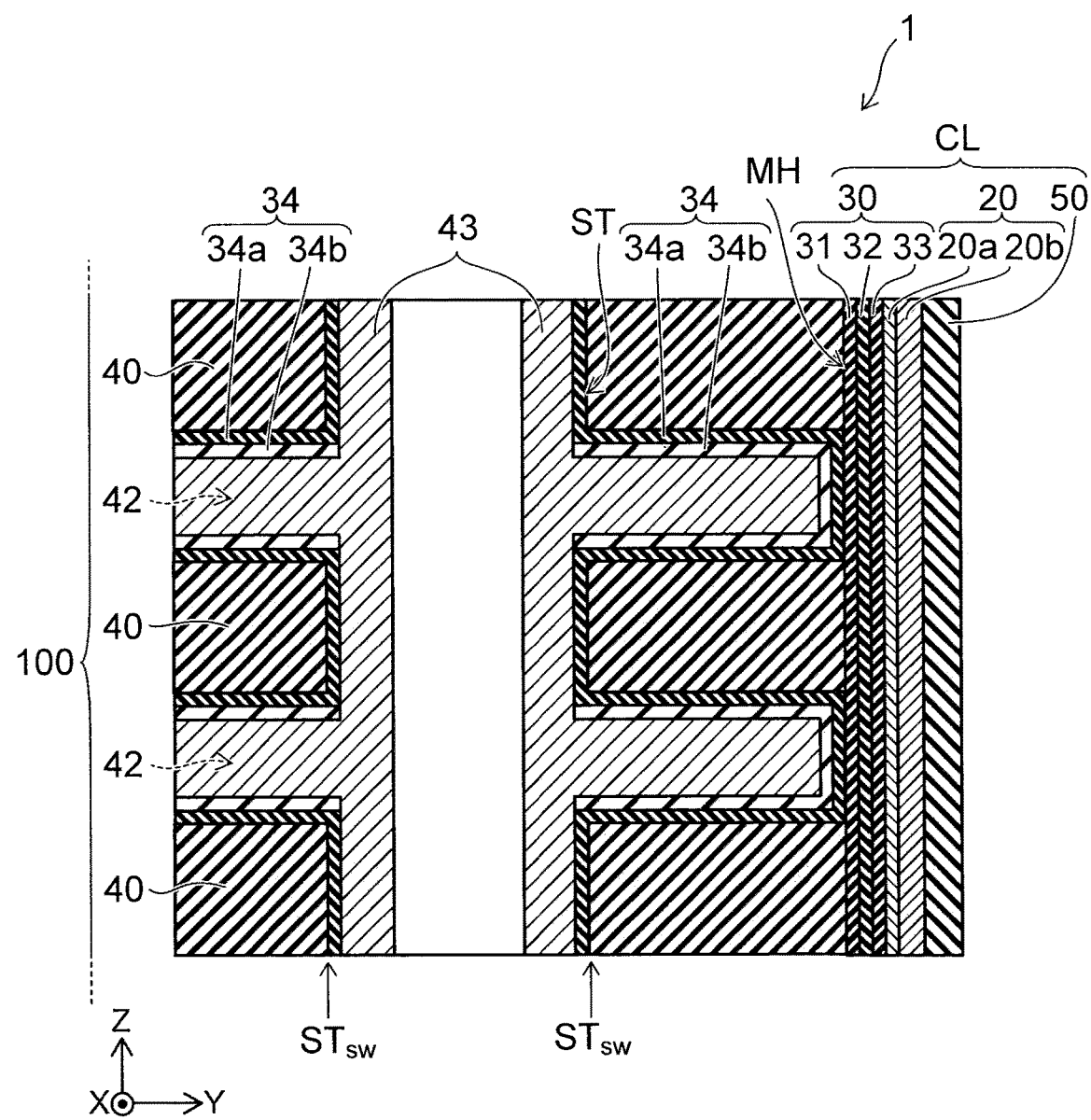

Then, as shown in FIG. 22, the conductor 43 is formed via the slit ST on an exposed surface 34ae of the first blocking insulating layer 34a and the second blocking insulating layer 34b of the space 42 interior. Thereby, the interior of the space 42 is filled with the conductor 43. The conductor 43 includes, for example, tungsten. The conductor 43 may be formed after forming a barrier film on the exposed surface 34ae and the second blocking insulating layer 34b of the space 42 interior.

Figure 23:
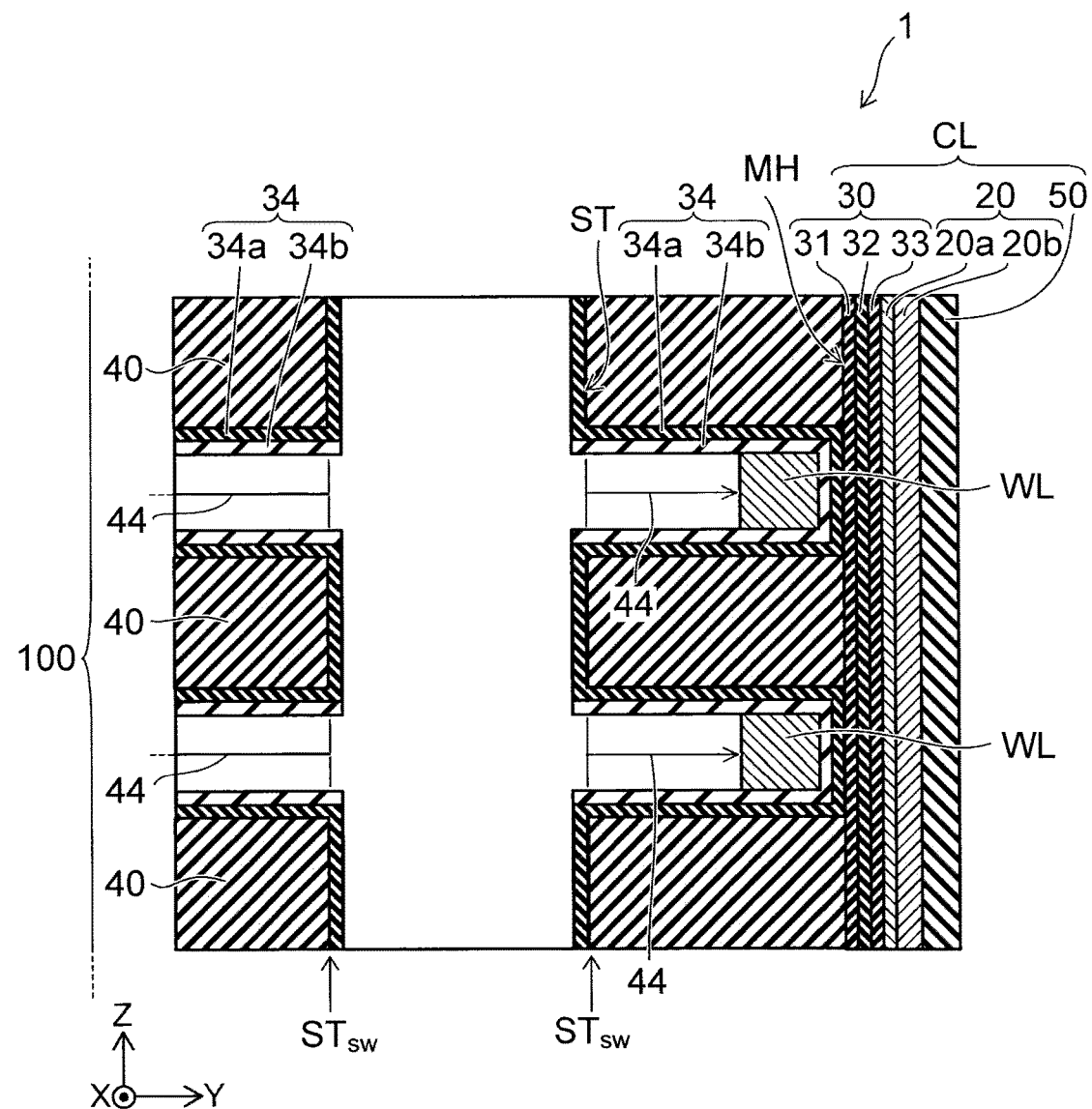

Then, as shown in FIG. 23, the conductor 43 is removed from the interior of the slit ST; further, the conductor 43 is caused to recede from the sidewall $ST_{SW}$ toward the columnar portion CL. Thereby, the recess portion 44 is formed between the insulator 40 and the insulator 40. Then, the conductor 43 is divided every region between the insulator 40 and the insulator 40; and the electrode layers (SGD, WL, and SGS) are formed. The electrode layers that are used to form the word lines WL are shown in FIG. 23.

Figure 24:
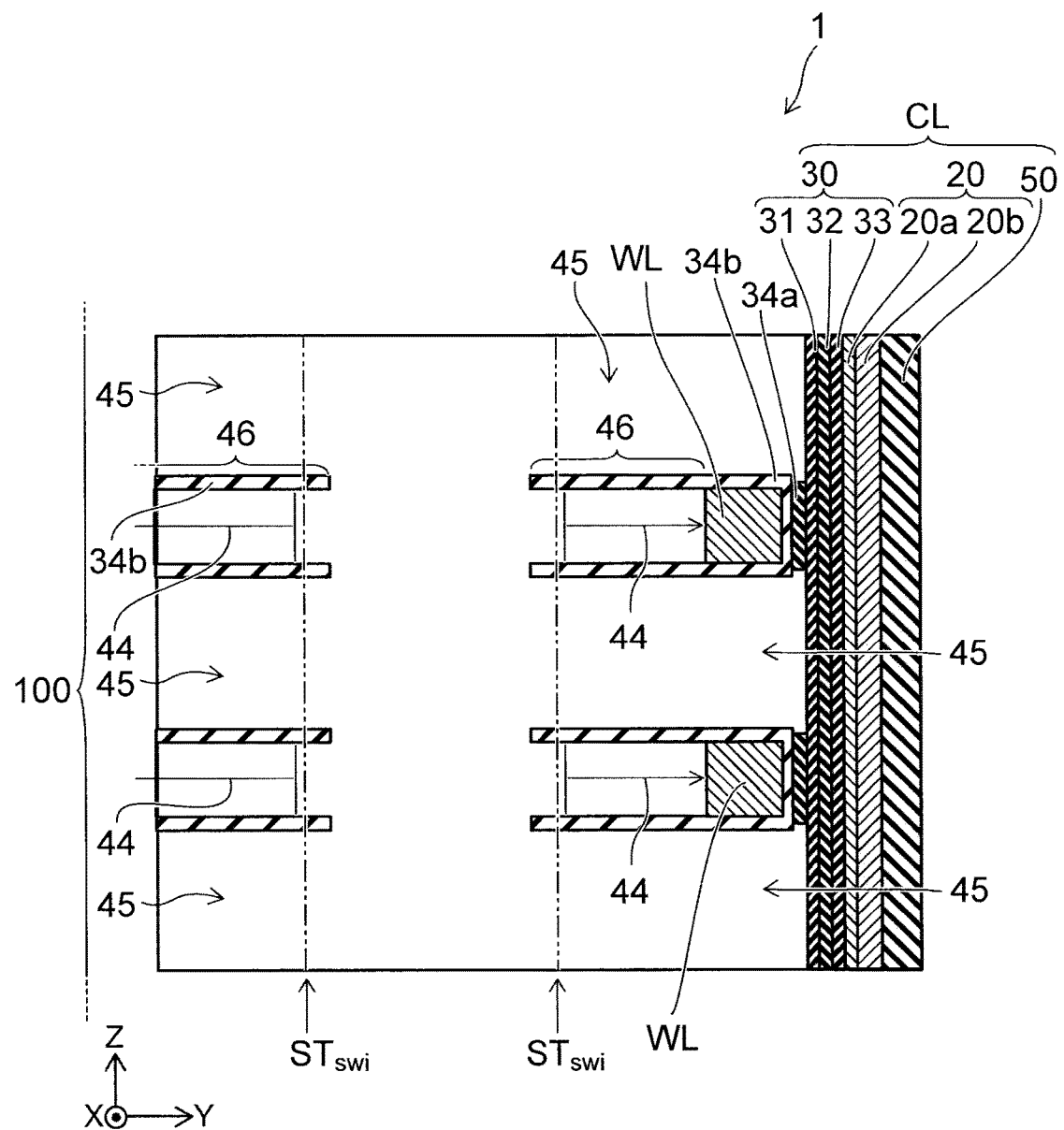

Then, as shown in FIG. 24, the first blocking insulating layer 34a and the insulator 40 are removed via the slit ST. Thereby, the air gap 45 is made between the electrode layer and the electrode layer, e.g., between the word line WL and the word line WL. Also, the first blocking insulating layer 34a and the insulator 40 include, for example, silicon oxide. However, the second blocking insulating layer 34b includes a metal oxide. Therefore, the second blocking insulating layer 34b is not removed. As a result, the protruding portion 46 that includes the second blocking insulating layer 34b is formed in the recess portion 44. In the stage shown in FIG. 24, the protruding portion 46 is formed between the air gap 45 and the recess portion 44. Also, the first blocking insulating layer 34a remains with the second blocking insulating layer 34b between the memory film 30 and the electrode layer, e.g., the word line WL.

Because FIG. 24 shows the intermediate portion of the stacked body 100, the slit ST is not shown. Instead, the estimated sidewall $ST_{SWi}$ of the slit ST is shown. For example, the slit ST is made in the insulating film 81 shown in FIG. 16.

Figure 25:
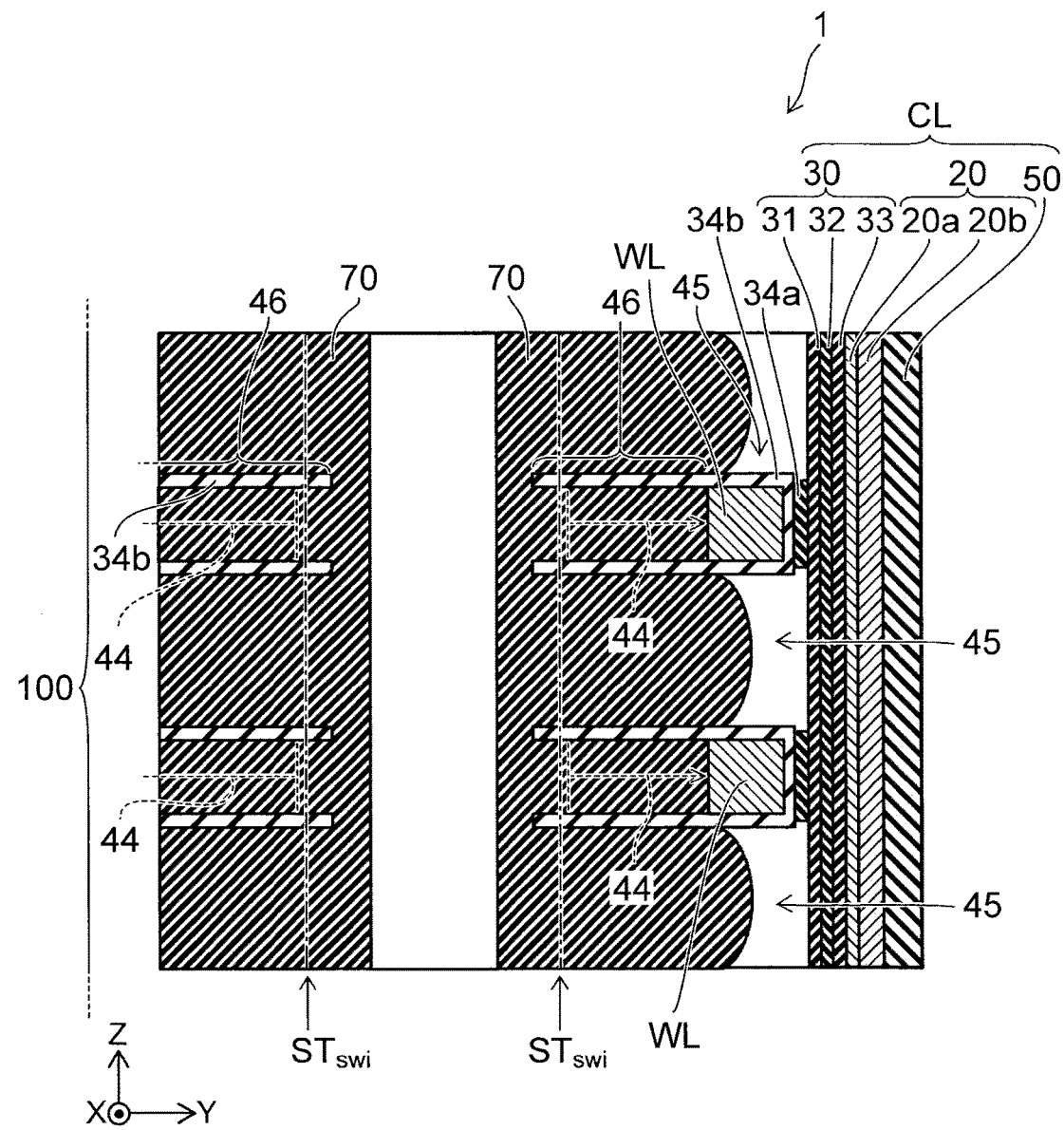

Then, as shown in FIG. 25, the sidewall insulating film 70 is formed via the slit ST on the protruding portion 46 and the electrode layers (SGD, WL, and SGS). In the third embodiment, the formation of the sidewall insulating film 70 is performed using conditions at which the air gap 45 is not filled completely but the recess portion 44 is filled completely. Thereby, the air gap 45 remains between the electrode layers (SGD, WL, and SGS). Then, the bottom portion of the sidewall insulating film 70 is etched. Thereby, the substrate 10 is exposed at the bottom of the slit ST (e.g., referring to FIG. 16).

Then, as shown in FIG. 17, the interior of the slit ST is filled with a conductor by forming the conductor on the sidewall insulating film 70 and the substrate 10 exposed at the bottom of the slit ST. Thereby, for example, the source line SL is formed in the interior of the slit ST. Then, the plate portion PT that includes the sidewall insulating film 70 and the source line SL is formed in the interior of the slit ST.

For example, the semiconductor device of the third embodiment can be manufactured by such a manufacturing method.

Fourth Embodiment

Figure 26:
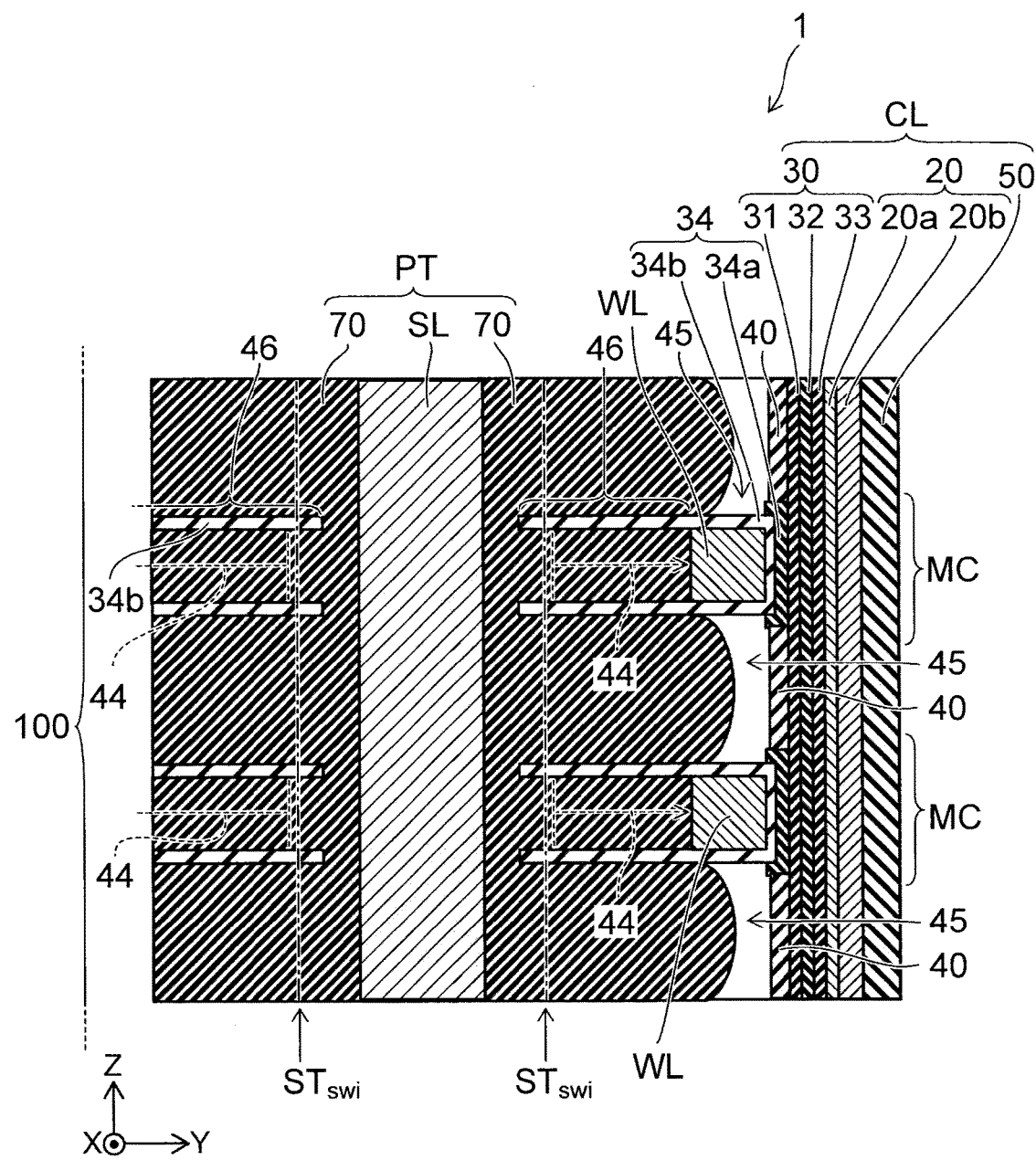
FIG. 26 is a schematic cross-sectional view of the memory cell array of a semiconductor device of a fourth embodiment.

FIG. 26 is a schematic cross-sectional view of the memory cell array 1 of a semiconductor device of a fourth embodiment. The cross section shown in FIG. 26 corresponds to the portion of area XX shown in FIG. 17.

As shown in FIG. 26, the fourth embodiment differs from the third embodiment in that the air gap 45 is provided partway through the insulator 40. Although the configuration is, for example, a configuration according to the example shown in FIG. 19, the insulator 40 is recessed partway through the columnar portion CL from the sidewall insulating film 70 in the example shown in FIG. 19. Thereby, the air gap 45 is formed partway through the columnar portion CL from the sidewall insulating film 70.

In the fourth embodiment, the insulator 40 is recessed from the sidewall insulating film 70 before reaching the columnar portion CL. Thereby, the air gap 45 is formed from the sidewall insulating film 70 to the region between the sidewall insulating film 70 and the columnar portion CL. Therefore, the columnar portion CL is provided in the interior of the insulator 40. The columnar portion CL is not exposed from the insulator 40.

According to the fourth embodiment, the insulator 40 exists at the periphery of the columnar portion CL. Therefore, even in the case where the air gap 45 is provided, compared to the case where the insulator 40 does not exist at the periphery of the columnar portion CL, the advantage can be obtained that the columnar portion CL can be protected by the insulator 40.

Fifth Embodiment

Figure 27:
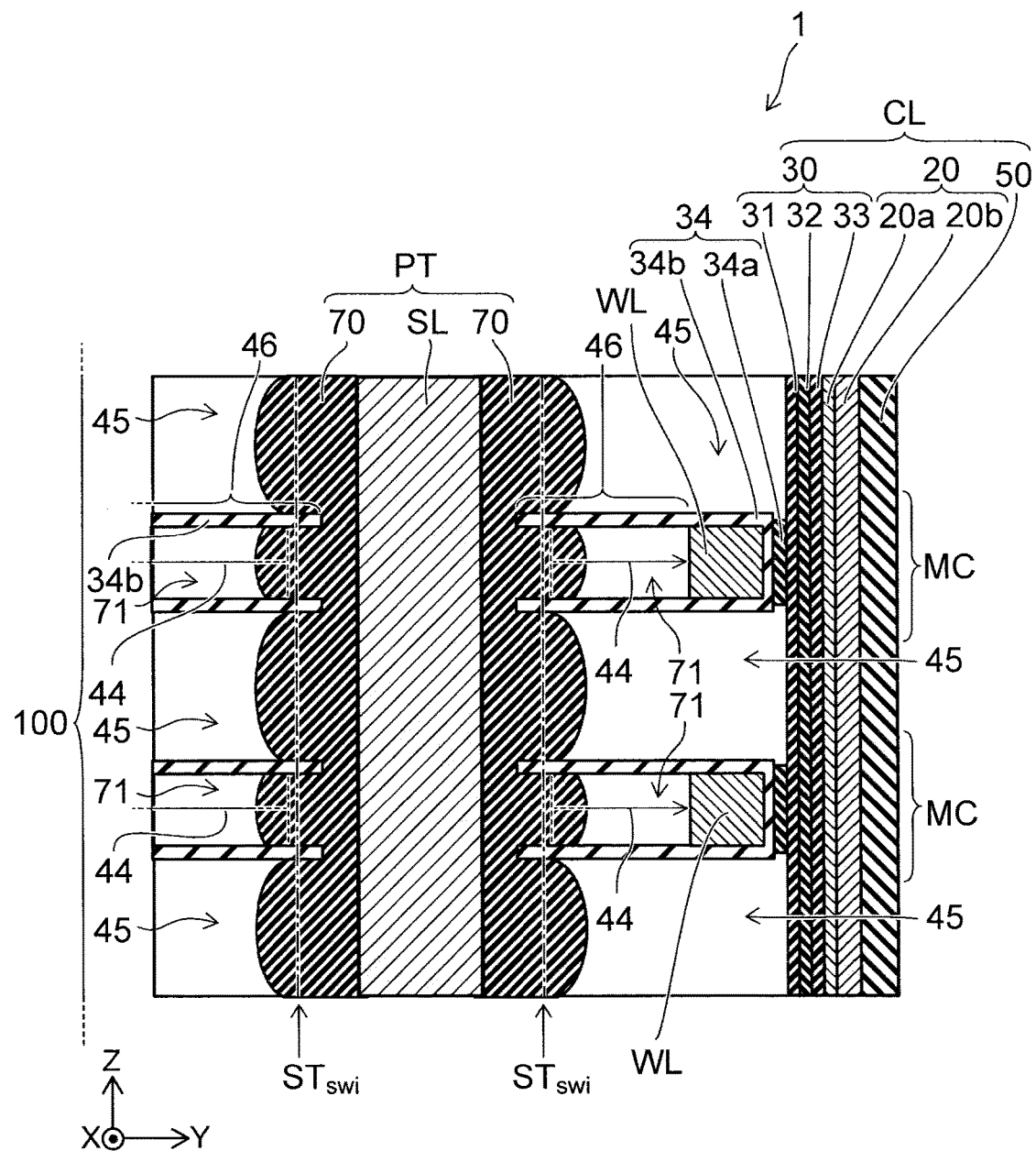
FIG. 27 is a schematic cross-sectional view of the memory cell array of a semiconductor device of a fifth embodiment.

FIG. 27 is a schematic cross-sectional view of the memory cell array 1 of a semiconductor device of a fifth embodiment. The cross section shown in FIG. 27 corresponds to the portion of area V shown in FIG. 4.

As shown in FIG. 27, the fifth embodiment is an embodiment in which the first embodiment and the third embodiment are combined.

Thus, it is possible to combine the first embodiment and the third embodiment.

Also, although not particularly illustrated, the first embodiment also can be combined with the fourth embodiment.

Thus, according to the embodiments, a semiconductor device can be obtained in which the electrical breakdown voltage between the source line and the electrode layers can be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a substrate having a major surface;
a stacked body provided on the major surface of the substrate, the stacked body including a plurality of electrode layers stacked with an insulator interposed;
a columnar portion provided in the stacked body, the columnar portion extending along a stacking direction of the stacked body, the columnar portion including a semiconductor body and a memory film, the memory film provided between the semiconductor body and the electrode layers, the memory film including a charge storage portion; and
a plate portion provided in the stacked body, the plate portion extending along the stacking direction of the stacked body and a major surface direction of the substrate, the plate portion including a plate conductor and a sidewall insulating film, the sidewall insulating film provided between the plate conductor and the stacked body,
the stacked body including an air gap,
the air gap provided between the sidewall insulating film and the electrode layers.

2. The device according to claim 1, wherein the air gap is provided to be continuous in the major surface direction of the substrate along the plate portion.

3. The device according to claim 1, wherein
the stacked body includes a lower layer portion and an upper layer portion, the lower layer portion including a lowermost electrode layer most proximal to the major surface of the substrate, the upper layer portion including an uppermost electrode layer most distal to the major surface of the substrate, and
the air gap is provided between the sidewall insulating film and all of the electrode layers from the lowermost electrode layer to the uppermost electrode layer.

4. The device according to claim 1, wherein
the stacked body includes a lower layer portion and an upper layer portion, the lower layer portion including a lowermost electrode layer most proximal to the major surface of the substrate, the upper layer portion including an uppermost electrode layer most distal to the major surface of the substrate, and
a spacing between the plate portion and the columnar portion is narrower at the upper layer portion than at the lower layer portion.

5. The device according to claim 1, wherein
the stacked body includes a lower layer portion and an upper layer portion, the lower layer portion including a lowermost electrode layer most proximal to the major surface of the substrate, the upper layer portion including an uppermost electrode layer most distal to the major surface of the substrate, and
the air gap is provided between the sidewall insulating film and a portion of the electrode layers from the lowermost electrode layer to the uppermost electrode layer.

6. A semiconductor device, comprising:
a substrate having a major surface;
a stacked body provided on the major surface of the substrate, the stacked body including a plurality of electrode layers stacked with a first air gap interposed;
a columnar portion provided in the stacked body, the columnar portion extending along a stacking direction of the stacked body, the columnar portion including a semiconductor body and a memory film, the memory film provided between the semiconductor body and the electrode layers, the memory film including a charge storage portion;
a plate portion provided in the stacked body, the plate portion extending along the stacking direction of the stacked body and a major surface direction of the substrate, the plate portion including a plate conductor and a sidewall insulating film, the sidewall insulating film provided between the plate conductor and the stacked body; and
a blocking insulating film provided in the stacked body, the blocking insulating film provided from a first portion to a second portion, the first portion provided between the electrode layer and the first air gap, the second portion provided between the electrode layer and the columnar portion.

7. The device according to claim 6, wherein
the stacked body includes a recess portion where the electrode layer is recessed along the major surface direction of the substrate from the plate portion toward the columnar portion,
the blocking insulating film in the recess portion includes a protruding portion protruding from the columnar portion toward the plate portion, and
the sidewall insulating film is provided along the stacking direction of the stacked body while including the protruding portion in an interior of the sidewall insulating film.

8. The device according to claim 6, wherein the blocking insulating film includes a first blocking insulating layer and a second blocking insulating layer.

9. The device according to claim 8, wherein
the first blocking insulating layer is provided at the second portion, and
the second blocking insulating layer is provided at the first portion and the second portion.

10. The device according to claim 7, wherein
the blocking insulating film includes a first blocking insulating layer and a second blocking insulating layer,
the first blocking insulating layer is provided at the second portion,
the second blocking insulating layer is provided at the first portion and the second portion, and
the protruding portion includes the second blocking insulating layer.

11. The device according to claim 8, wherein a relative dielectric constant of the second blocking insulating layer is higher than a relative dielectric constant of the first blocking insulating layer.

12. The device according to claim 11, wherein
the first blocking insulating layer includes silicon oxide, and the second blocking insulating layer includes a metal oxide.

13. The device according to claim 6, wherein
the stacked body includes a second air gap, and
the second air gap is provided between the sidewall insulating film and the electrode layers.

14. The device according to claim 13, wherein the second air gap is provided to be continuous in the major surface direction of the substrate along the plate portion.

15. The device according to claim 13, wherein
the stacked body includes a lower layer portion and an upper layer portion, the lower layer portion including a lowermost electrode layer most proximal to the major surface of the substrate, the upper layer portion including an uppermost electrode layer most distal to the major surface of the substrate, and
a spacing between the plate portion and the columnar portion is narrower at the upper layer portion than at the lower layer portion.

16. The device according to claim 13, wherein
the stacked body includes a lower layer portion and an upper layer portion, the lower layer portion including a lowermost electrode layer most proximal to the major surface of the substrate, the upper layer portion including an uppermost electrode layer most distal to the major surface of the substrate, and the second air gap is provided between the sidewall insulating film and all of the electrode layers from the lowermost electrode layer to the uppermost electrode layer.

17. The device according to claim 13, wherein
the stacked body includes a lower layer portion and an upper layer portion, the lower layer portion including a lowermost electrode layer most proximal to the major surface of the substrate, the upper layer portion including an uppermost electrode layer most distal to the major surface of the substrate, and the second air gap is provided between the sidewall insulating film and a portion of the electrode layers from the lowermost electrode layer to the uppermost electrode layer.

* * * * *